(12) United States Patent
Lai et al.

(10) Patent No.: US 12,015,090 B2
(45) Date of Patent: *Jun. 18, 2024

(54) LIGHTLY-DOPED CHANNEL EXTENSIONS

(71) Applicant: Taiwan Semiconductor Manufacturing Company, Ltd., Hsinchu (TW)

(72) Inventors: Wei-Jen Lai, Keelung (TW); Wei-Yuan Lu, Taipei (TW); Chih-Hao Yu, Tainan (TW); Chia-Pin Lin, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/813,975

(22) Filed: Jul. 21, 2022

(65) Prior Publication Data

US 2022/0359769 A1 Nov. 10, 2022

Related U.S. Application Data

(63) Continuation of application No. 17/081,399, filed on Oct. 27, 2020, now Pat. No. 11,489,078.

(51) Int. Cl.
*H01L 29/786* (2006.01)
*H01L 29/06* (2006.01)
(Continued)

(52) U.S. Cl.
CPC .... *H01L 29/78696* (2013.01); *H01L 29/0653* (2013.01); *H01L 29/42392* (2013.01); *H01L 29/66545* (2013.01); *H01L 29/66553* (2013.01); *H01L 29/66742* (2013.01); *H01L 29/66787* (2013.01); *H01L 29/7848* (2013.01); *H01L 29/78621* (2013.01); *H01L 29/0847* (2013.01); *H01L 29/165* (2013.01); *H01L 29/78684* (2013.01)

(58) Field of Classification Search
CPC .......... H01L 29/78696; H01L 29/0653; H01L 29/42392; H01L 29/66545; H01L 29/66553; H01L 29/66742; H01L 29/66787; H01L 29/7848; H01L 29/78621; H01L 29/0847; H01L 29/165; H01L 29/78684; H01L 29/0673; H01L 29/775; H01L 29/66439; H01L 29/167; H01L 29/161; H01L 29/7833; H01L 29/0684; H01L 29/1033; H01L 29/66492; H01L 29/66795; H01L 29/785; B82Y 10/00
USPC .......................................................... 257/192
See application file for complete search history.

(56) References Cited

U.S. PATENT DOCUMENTS 9,818,872 B2 11/2017 Ching et al.
9,887,269 B2 2/2018 Ching et al.
(Continued)

*Primary Examiner* — Tong-Ho Kim
(74) *Attorney, Agent, or Firm* — Haynes and Boone, LLP

(57) ABSTRACT

A semiconductor structure and a method of forming the same are provided. A semiconductor structure according to the present disclosure includes a first channel member and a second channel member disposed over the first channel member, a first channel extension feature coupled to the first channel member, a second channel extension feature coupled to the second channel member, and an inner spacer feature disposed between the first channel extension feature and the second channel extension feature.

20 Claims, 28 Drawing Sheets

(51) Int. Cl.
  *H01L 29/423* (2006.01)
  *H01L 29/66* (2006.01)
  *H01L 29/78* (2006.01)
  H01L 29/08 (2006.01)
  H01L 29/165 (2006.01)

(56) References Cited

U.S. PATENT DOCUMENTS

| | | |
|---|---|---|
| 9,899,398 B1 | 2/2018 | Colinge et al. |
| 10,032,627 B2 | 7/2018 | Lee et al. |
| 10,157,799 B2 | 12/2018 | Ching et al. |
| 10,199,502 B2 | 2/2019 | Huang et al. |
| 10,290,546 B2 | 5/2019 | Chiang et al. |
| 10,475,902 B2 | 11/2019 | Lee et al. |
| 11,489,078 B2 * | 11/2022 | Lai ................... H01L 29/0653 |
| 2016/0365411 A1 | 12/2016 | Yeh et al. |
| 2018/0047832 A1 | 2/2018 | Tapily et al. |
| 2018/0175036 A1 | 6/2018 | Ching et al. |
| 2019/0067490 A1 | 2/2019 | Yang et al. |
| 2019/0189769 A1 | 6/2019 | Basker et al. |
| 2020/0220018 A1* | 7/2020 | Jang .................. H01L 29/0847 |
| 2020/0266060 A1* | 8/2020 | Cheng ................ H01L 29/0673 |
| 2020/0357931 A1 | 11/2020 | Lee et al. |

* cited by examiner

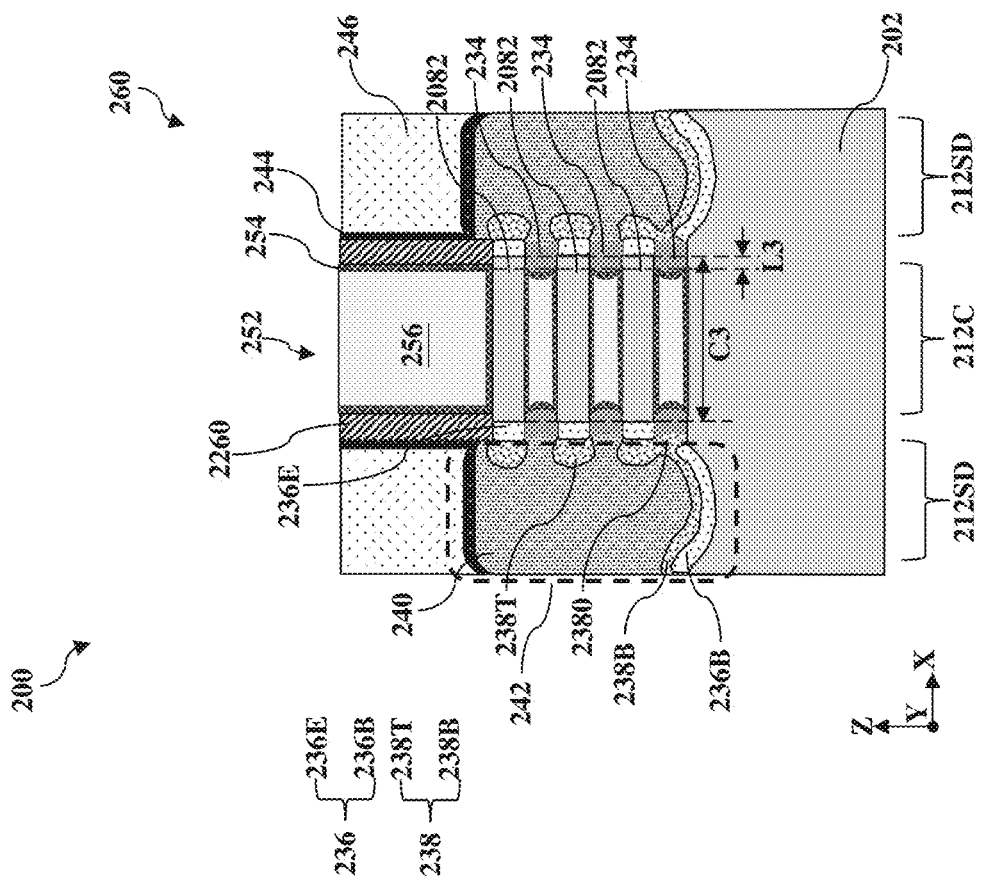

LIGHTLY-DOPED CHANNEL EXTENSIONS

PRIORITY DATA

This application is a continuation of U.S. patent application Ser. No. 17/081,399, filed Oct. 27, 2020, the entirety of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate metal-oxide-semiconductor field effect transistor (multi-gate MOSFET, or multi-gate devices) have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor.

In an MBC transistor, a source/drain feature may be spaced apart from the channel region due to presence of various gate spacer layers. The portion of the channel members that falls outside the channel region may reduce performance of the MBC transistor. While conventional MBC transistors are generally adequate to their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2-10, 11A-19A, and 11B-19B illustrate fragmentary cross-sectional views of a workpiece during a fabrication process according to the method of FIG. 1, according to one or more aspects of the present disclosure.

DETAILED DESCRIPTION

Figure 1:
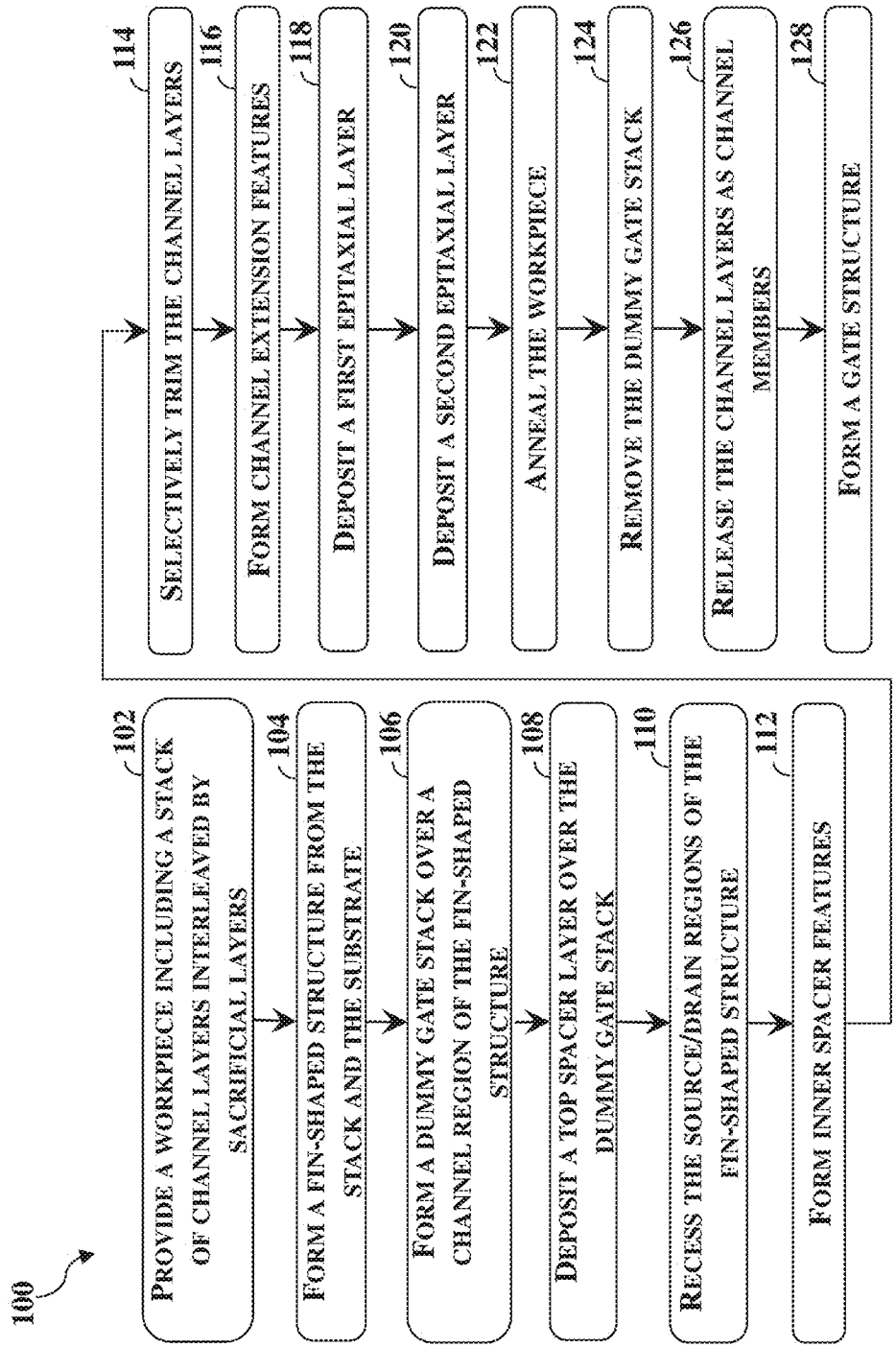
FIG. 1 illustrates a flowchart of a method for forming a semiconductor device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to MBC transistors and fabrication methods, and more particularly to channel extension features that serve as lightly doped drain (LDD) features. Channel members of an MBC transistor extend between and are coupled to two source/drain features. Due to formation of top spacers and inner spacer features to facilitate replacement of a dummy gate stack with a functional gate structure, the junction between a source/drain feature and the channel members are spaced apart from the channel region by at least the thickness of the inner spacer features or the top spacers. The distance between the junction and the channel region may be referred to as proximity. In some conventional technology, the proximity may be substantially equal to the spacer thickness. As the portion of the channel member between the channel region and the junction is undoped, it increases parasitic resistance of the MBC transistor.

The present disclosure provides embodiments of an MBC device structure where the channel members are selectively trimmed after the formation inner spacer features to reduce proximity to the channel region. A doped semiconductor layer is selectively deposited on the end surfaces of the trimmed channel members to form channel extension features to serve as LDD features. The channel extension features may be vertically disposed between an inner spacer feature and a top spacer or between inner spacer features. In one embodiment, the doped semiconductor layer is more etch-resistant than the source/drain feature. For example, the doped semiconductor layer may be formed of boron-doped silicon (Si:B) and the source/drain feature is formed of boron-doped silicon germanium (SiGe:B). For another example, the doped semiconductor layer may be formed of phosphorus and carbon-doped silicon (Si:C:P) and the source/drain feature is formed of phosphorus-doped silicon (Si:P) or arsenic-doped silicon (Si:As). A portion of the doped semiconductor layer is also deposited over a substrate exposed in a source/drain trench.

The various aspects of the present disclosure will now be described in more detail with reference to the figures. In that regard, FIG. 1 is a flowchart illustrating a method 100 of forming a semiconductor device from a workpiece according to embodiments of the present disclosure. Method 100 is merely an example and is not intended to limit the present disclosure to what is explicitly illustrated in method 100. Additional steps can be provided before, during and after the method 100, and some steps described can be replaced, eliminated, or moved around for additional embodiments of the method. Not all steps are described herein in detail for reasons of simplicity. Method 100 is described below in conjunction with FIGS. 2-10, 11A-19A, and 11B-19B, which are fragmentary cross-sectional views of 1 workpiece 200 at different stages of fabrication according to embodiments of the method 100 in FIG. 1. Because the workpiece 200 will be fabricated into a semiconductor device, the workpiece 200 may be referred to herein as a semiconductor device 200 as the context requires. For avoidance, the X, Y and Z directions in FIGS. 2-10, 11A-19A, and 11B-19B are perpendicular to one another. Additionally, throughout the disclosure, like reference numerals may denote like features.

Figure 2:
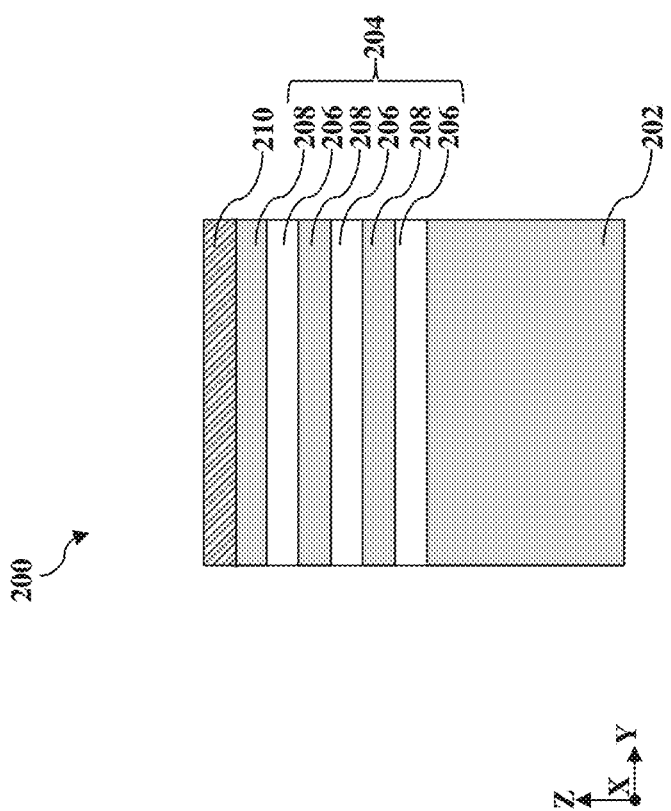

Referring to FIGS. 1 and 2, method 100 includes a block 102 where a stack 204 of alternating semiconductor layers is formed over the workpiece 200. As shown in FIG. 2, the workpiece 200 includes a substrate 202. In some embodiments, the substrate 202 may be a semiconductor substrate such as a silicon (Si) substrate. The substrate 202 may include various doping configurations depending on design requirements as is known in the art. In embodiments where the semiconductor device is p-type, an n-type doping profile (i.e., an n-type well or n-well) may be formed on the substrate 202. In some implementations, the n-type dopant for forming the n-type well may include phosphorus (P) or arsenide (As). In embodiments where the semiconductor device is n-type, a p-type doping profile (i.e., a p-type well or p-well) may be formed on the substrate 202. In some implementations, the n-type dopant for forming the p-type well may include boron (B) or gallium (Ga). The suitable doping may include ion implantation of dopants and/or diffusion processes. The substrate 202 may also include other semiconductors such as germanium (SiGe), silicon carbide (SiC), silicon germanium (SiGe), or diamond. Alternatively, the substrate 202 may include a compound semi-conductor and/or an alloy semiconductor. Further, the substrate 202 may optionally include an epitaxial layer (epi-layer), may be strained for performance enhancement, may include a silicon-on-insulator (SOI) or a germanium-on-insulator (GeOI) structure, and/or may have other suitable enhancement features.

In some embodiments, the stack 204 includes sacrificial layers 206 of a first semiconductor composition interleaved by channel layers 208 of a second semiconductor composition. The first and second semiconductor composition may be different. In some embodiments, the sacrificial layers 206 include silicon germanium (SiGe) and the channel layers 208 include silicon (Si). It is noted that three (3) layers of the sacrificial layers 206 and three (3) layers of the channel layers 208 are alternately arranged as illustrated in FIG. 2, which is for illustrative purposes only and not intended to be limiting beyond what is specifically recited in the claims. It can be appreciated that any number of epitaxial layers may be formed in the stack 204. The number of layers depends on the desired number of channels members for the semiconductor device 200. In some embodiments, the number of channel layers 208 is between 2 and 10.

In some embodiments, all sacrificial layers 206 may have a substantially uniform first thickness and all of the channel layers 208 may have a substantially uniform second thickness. The first thickness and the second thickness may be identical or different. As described in more detail below, the channel layers 208 or parts thereof may serve as channel member(s) for a subsequently-formed multi-gate device and the thickness of each of the channel layers 208 is chosen based on device performance considerations. The sacrificial layers 206 in channel regions(s) may eventually be removed and serve to define a vertical distance (along the Z direction) between adjacent channel region(s) for a subsequently-formed multi-gate device and the thickness of each of the sacrificial layers 206 is chosen based on device performance considerations.

The layers in the stack 204 may be deposited using a molecular beam epitaxy (MBE) process, a vapor phase deposition (VPE) process, and/or other suitable epitaxial growth processes. As stated above, in at least some examples, the sacrificial layers 206 include an epitaxially grown silicon germanium (SiGe) layer and the channel layers 208 include an epitaxially grown silicon (Si) layer. In some embodiments, the sacrificial layers 206 and the channel layers 208 are substantially dopant-free (i.e., having an extrinsic dopant concentration from about 0 $cm^{-3}$ to about $1\times10^{17}$ $cm^{-3}$), where for example, no intentional doping is performed during the epitaxial growth processes for the stack 204.

Figure 3:
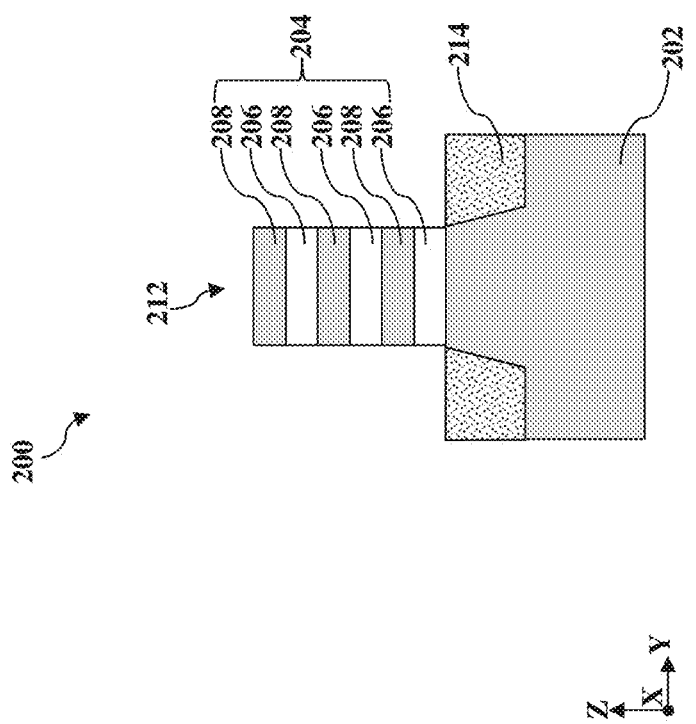

Referring still to FIGS. 1, 2 and 3, method 100 includes a block 104 where a fin-shaped structure 212 is formed from the stack 204 and the substrate 202. To pattern the stack 204, a hard mask layer 210 (shown in FIG. 2) may be deposited over the stack 204 to form an etch mask. The hard mask layer 210 may be a single layer or a multi-layer. For example, the hard mask layer 210 may include a pad oxide layer and a pad nitride layer over the pad oxide layer. The fin-shaped structure 212 may be patterned from the stack 204 and the substrate 202 using a lithography process and an etch process. The lithography process may include photo-resist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etching (e.g., RIE etching), wet etching, and/or other etching methods. As shown in FIG. 3, the etch process at block 104 forms trenches extending through the stack 204 and a portion of the substrate 202. The trenches define the fin-shaped structures 212. In some implementations, double-patterning or multi-patterning processes may be used to define fin-shaped structures that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the fin-shaped structure 212 by etching the stack 204. As shown in FIG. 3, the fin-shaped structure 212, along with the sacrificial layers 206 and the channel layers 208 therein, extends vertically along the Z direction and lengthwise along the X direction.

An isolation feature 214 is formed adjacent the fin-shaped structure 212. In some embodiments, the isolation feature 214 may be formed in the trenches to isolate the fin-shaped structures 212 from a neighboring active region. The isolation feature 214 may also be referred to as a shallow trench isolation (STI) feature 214. By way of example, in some embodiments, a dielectric layer is first deposited over the substrate 202, filling the trenches with the dielectric layer. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, a spin-on coating process, and/or other suitable process. The deposited dielectric material is then thinned and planarized, for example by a chemical mechanical polishing (CMP) process. The planarized dielectric layer is further recessed or pulled-back by a dry etching process, a wet etching process, and/or a combination thereof to form the STI feature 214. The fin-shaped structure 212 rises above the STI feature 214 after the recessing.

Figure 4:
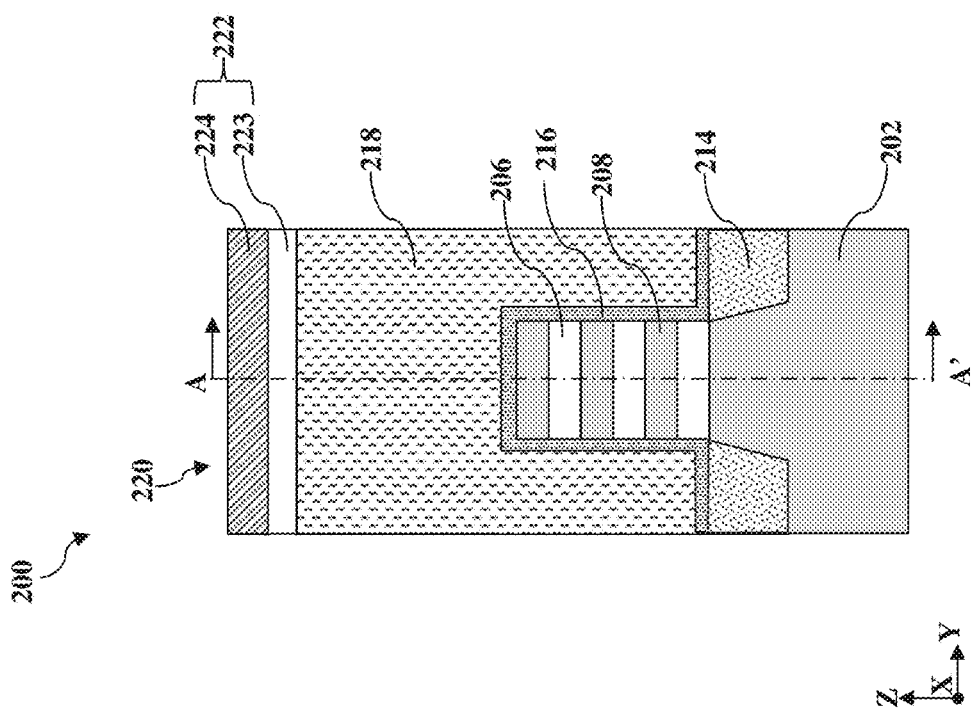
Figure 5:
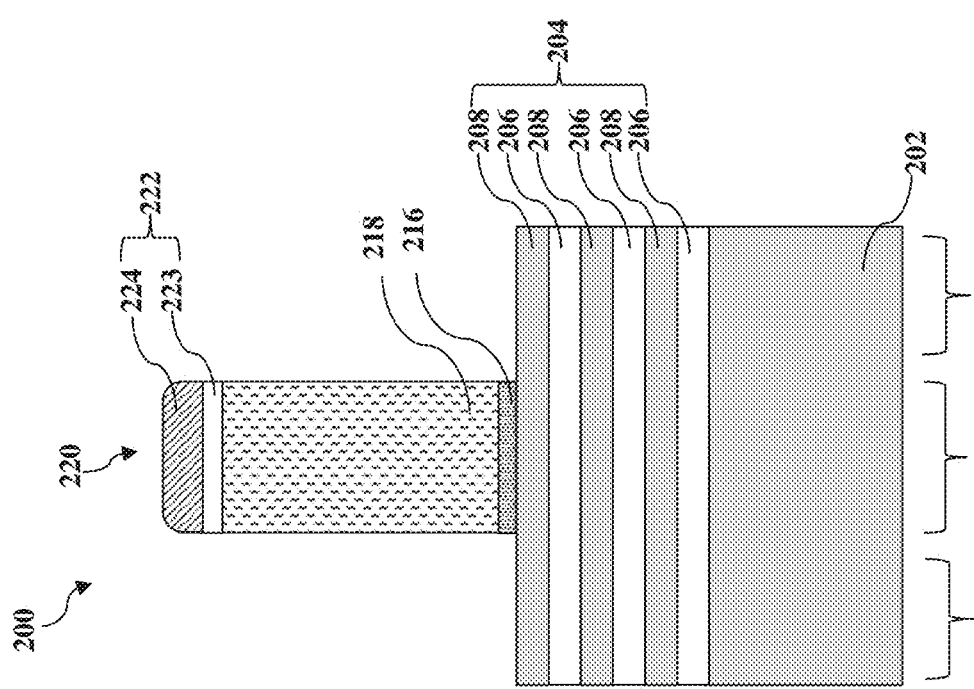

Referring to FIGS. 1, 4 and 5, method 100 includes a block 106 where a dummy gate stack 220 is formed over a channel region 212C of the fin-shaped structure 212. In some embodiments, a gate replacement process (or gate-last process) is adopted where the dummy gate stack 220 (shown in FIGS. 4 and 5) serves as a placeholder to undergo various processes and is to be removed and replaced by the functional gate structure. Other processes and configuration are possible. In some embodiments illustrated in FIG. 5, the dummy gate stack 220 is formed over the fin-shaped structure 212 and the fin-shaped structure 212 may be divided into channel regions 212C underlying the dummy gate stacks 220 and source/drain regions 212SD that do not underlie the dummy gate stacks 220. The channel regions 212C are adjacent the source/drain regions 212SD. As shown in FIG. 5, the channel region 212C is disposed between two source/drain regions 212SD along the X direction.

The formation of the dummy gate stack 220 may include deposition of layers in the dummy gate stack 220 and patterning of these layers. Referring to FIG. 4, a dummy dielectric layer 216, a dummy electrode layer 218, and a gate-top hard mask layer 222 may be blanketly deposited over the workpiece 200. In some embodiments, the dummy dielectric layer 216 may be formed on the fin-shaped structure 21 using a chemical vapor deposition (CVD) process, an ALD process, an oxygen plasma oxidation process, or other suitable processes. In some instances, the dummy dielectric layer 216 may include silicon oxide. Thereafter, the dummy electrode layer 218 may be deposited over the dummy dielectric layer 216 using a CVD process, an ALD process, or other suitable processes. In some instances, the dummy electrode layer 218 may include polysilicon. For patterning purposes, the gate-top hard mask layer 222 may be deposited on the dummy electrode layer 218 using a CVD process, an ALD process, or other suitable processes. The gate-top hard mask layer 222, the dummy electrode layer 218 and the dummy dielectric layer 216 may then be patterned to form the dummy gate stack 220, as shown in FIGS. 4 and 5. For example, the patterning process may include a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, the gate-top hard mask layer 222 may include a silicon oxide layer 223 and a silicon nitride layer 224 over the silicon oxide layer 223. As shown in FIG. 5, no dummy gate stack 220 is disposed over the source/drain region 212SD of the fin-shaped structure 212.

Figure 6:
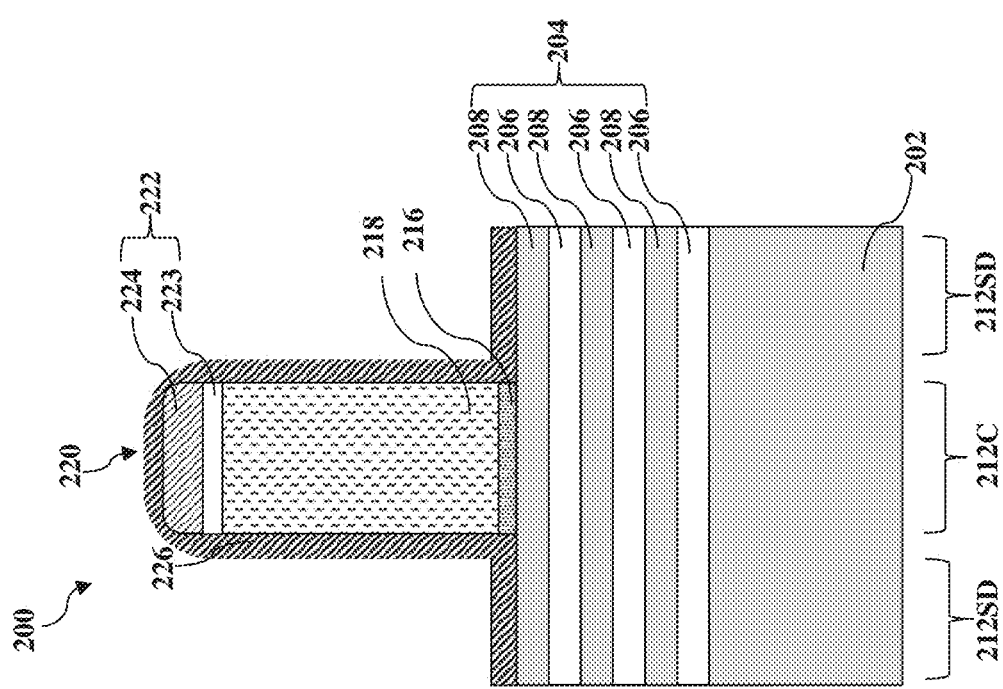

Referring to FIGS. 1 and 6, method 100 includes a block 108 where a top spacer layer 226 is deposited over the dummy gate stack 220. In some embodiments, the top spacer layer 226 is deposited conformally over the workpiece 200, including over top surfaces and sidewalls of the dummy gate stack 220. The term "conformally" may be used herein for ease of description of a layer having substantially uniform thickness over various regions. The top spacer layer 226 may be a single layer or a multi-layer. The top spacer layer 226 may include silicon carbonitride, silicon oxycarbide, silicon oxycarbonitride, or silicon nitride. In some implementations, the top spacer layer 226 may be deposited over the dummy gate stack 220 using processes such as, a CVD process, a subatmospheric CVD (SACVD) process, an ALD process, or other suitable process.

Figure 7:
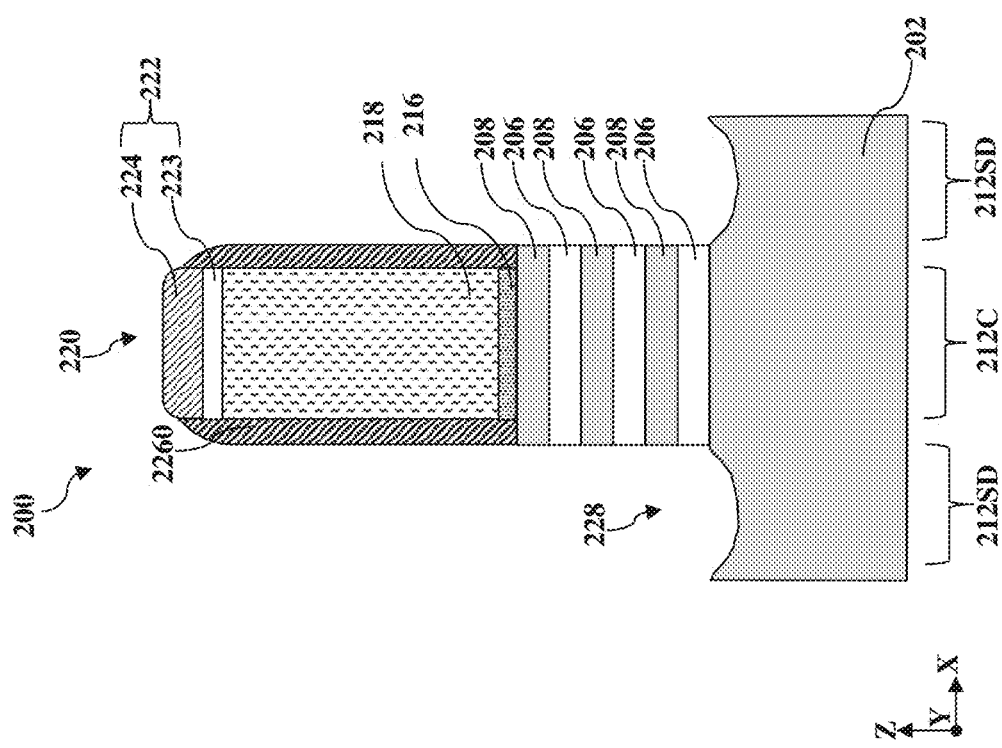

Referring to FIGS. 1 and 7, method 100 includes a block 110 where a source/drain region 212SD of the fin-shaped structure 212 is recessed to form a source/drain trench 228. As shown in FIG. 7, the recess at block 110 may remove the top facing portion of the top spacer layer 226 to form a top spacer 2260 disposed along sidewalls of the dummy gate stack 220. In some embodiments, the source/drain regions 212SD that are not covered by the dummy gate stack 220 are etched by a dry etch or a suitable etching process to form the source/drain trenches 228. For example, the dry etch process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or CHBR3), an iodine-containing gas, other suitable gases and/or plasmas, and/or combinations thereof. In some embodiments represented in FIG. 7, the source/drain regions 212SD of the fin-shaped structure 212 are recessed to expose sidewalls of the sacrificial layers 206 and the channel layers 208. In some implementations, the source/drain trenches 228 extend below the stack 204 into the substrate 202. As shown in FIG. 7, the sacrificial layers 206 and channel layers 208 in the source/drain region 212SD are removed at block 110, exposing the substrate 202 and sidewalls of the sacrificial layers 206 and channel layers 208.

Figure 8:
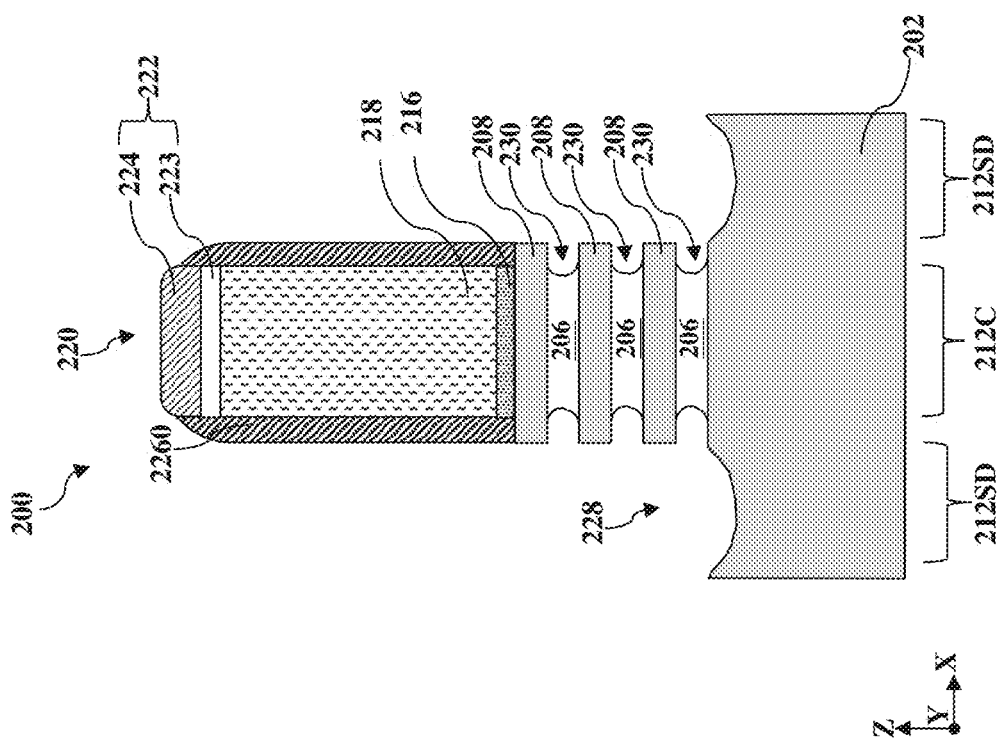
Figure 9:
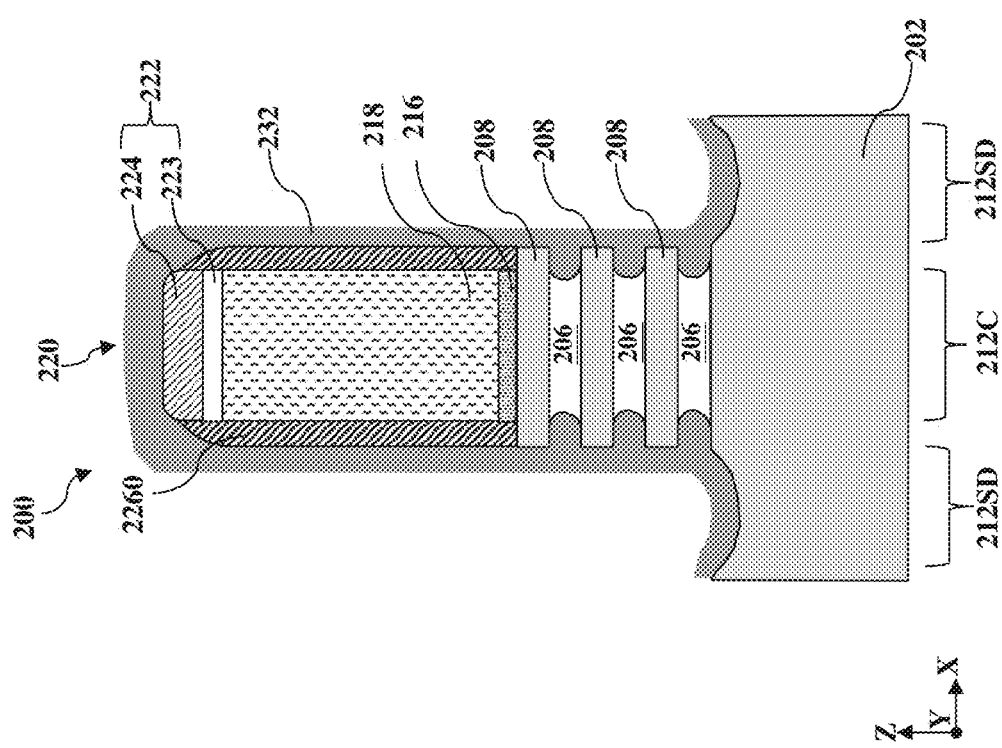
Figure 10:
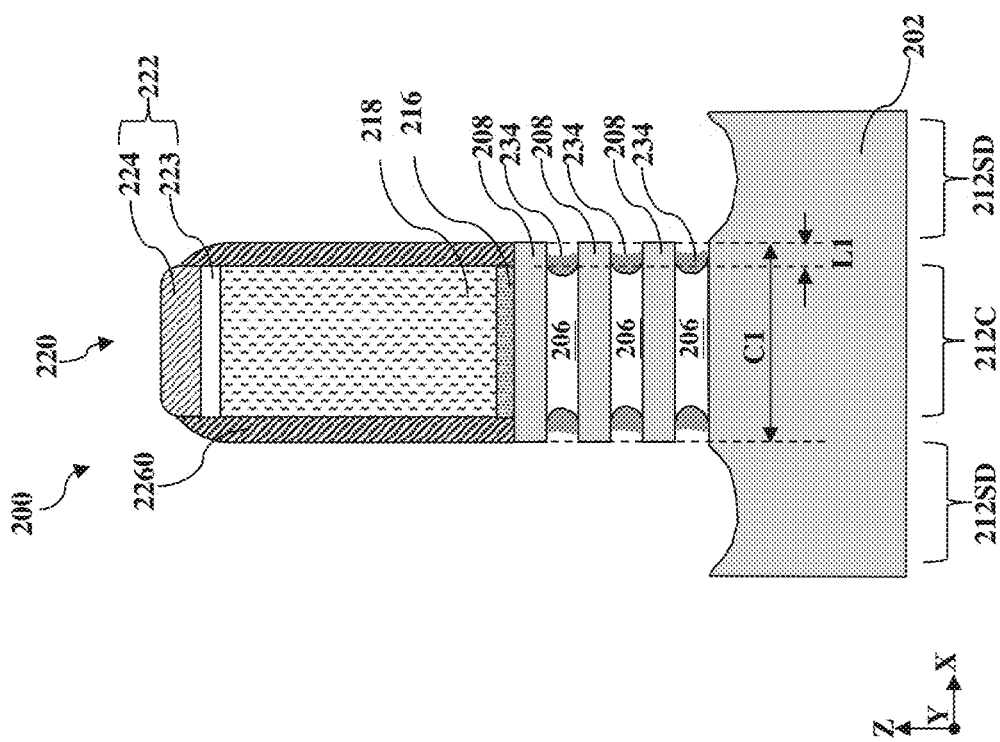

Referring to FIGS. 1, 8, 9, and 10, method 100 includes a block 112 where inner spacer features 234 are formed. While not shown explicitly, operation at block 112 may include selective and partial removal of the sacrificial layers 206 to form inner spacer recesses 230 (shown in FIG. 8), deposition of inner spacer material 232 over the workpiece 200 (shown in FIG. 9), and etch back the inner spacer material 232 to form inner spacer features 234 in the inner spacer recesses 230 (FIG. 10). Reference is made to FIG. 8. The sacrificial layers 206 exposed in the source/drain trenches 228 are selectively and partially recessed to form inner spacer recesses 230 while the top spacer 2260, the exposed portion of the substrate 202, and the channel layers 208 are substantially unetched. In an embodiment where the channel layers 208 consist essentially of silicon (Si) and sacrificial layers 206 consist essentially of silicon germanium (SiGe), the selective recess of the sacrificial layers 206 may be performed using a selective wet etch process or a selective dry etch process. The selective and partial recess of the sacrificial layers 206 may include a SiGe oxidation process followed by a SiGe oxide removal. In that embodiments, the SiGe oxidation process may include use of ozone. In some other embodiments, the selective dry etching process may include use of one or more fluorine-based etchants, such as fluorine gas or hydrofluorocarbons. The selective wet etching process may include an APM etch (e.g., ammonia hydroxide-hydrogen peroxide-water mixture).

Referring to FIG. 9, after the inner spacer recesses 230 are formed, the inner spacer material 232 is deposited over the workpiece 200, including over the inner spacer recesses 230. The inner spacer material 232 may include metal oxides, silicon oxide, silicon oxycarbonitride, silicon nitride, silicon oxynitride, carbon-rich silicon carbonitride, or a low-k dielectric material. The metal oxides may include aluminum oxide, zirconium oxide, tantalum oxide, yttrium oxide, titanium oxide, lanthanum oxide, or other suitable metal oxide. While not explicitly shown, the inner spacer material 232 may be a single layer or a multilayer. In some implementations, the inner spacer material 232 may be deposited using CVD, PECVD, SACVD, ALD or other suitable methods. The inner spacer material 232 is deposited into the inner spacer recesses 230 as well as over the sidewalls of the channel layers 208 exposed in the source/drain trenches 228. Referring to FIG. 10, the deposited inner spacer material 232 is then etched back to remove the inner spacer material 232 from the sidewalls of the channel layers 208 to form the inner spacer features 234 in the inner spacer recesses 230. At block 112, the inner spacer material 232 may also be removed from the top surfaces and/or sidewalls of the gate-top hard mask layer 222 and the top spacer 2260. In some implementations, the etch back operations performed at block 112 may include use of hydrogen fluoride (HF), fluorine gas ($F_2$), hydrogen ($H_2$), ammonia ($NH_3$), nitrogen trifluoride ($NF_3$), or other fluorine-based etchants.

As shown in FIG. 10, each of the inner spacer features 234 is in direct contact with the recessed sacrificial layers 206 and is disposed between two neighboring channel layers 208. That is, the inner spacer features 234 interleave the channel layers 208. In some instances, each of the inner spacer features 234 measures between about 1 nm and about 8 nm think along the X direction. Upon conclusion of the operations at block 112, the channel layers 208 in the channel region 212C include a first channel width C1 along the X direction and a distance between an outer end surface of a channel member 208 and an outer end surface of an adjacent sacrificial layer 206 define a first LDD proximity L1 along the X direction. In some instances, the first channel width C1 is between about 25 nm and about 50 nm and the first LDD proximity L1 may be between about 6 nm and about 10 nm.

Figure 11A:
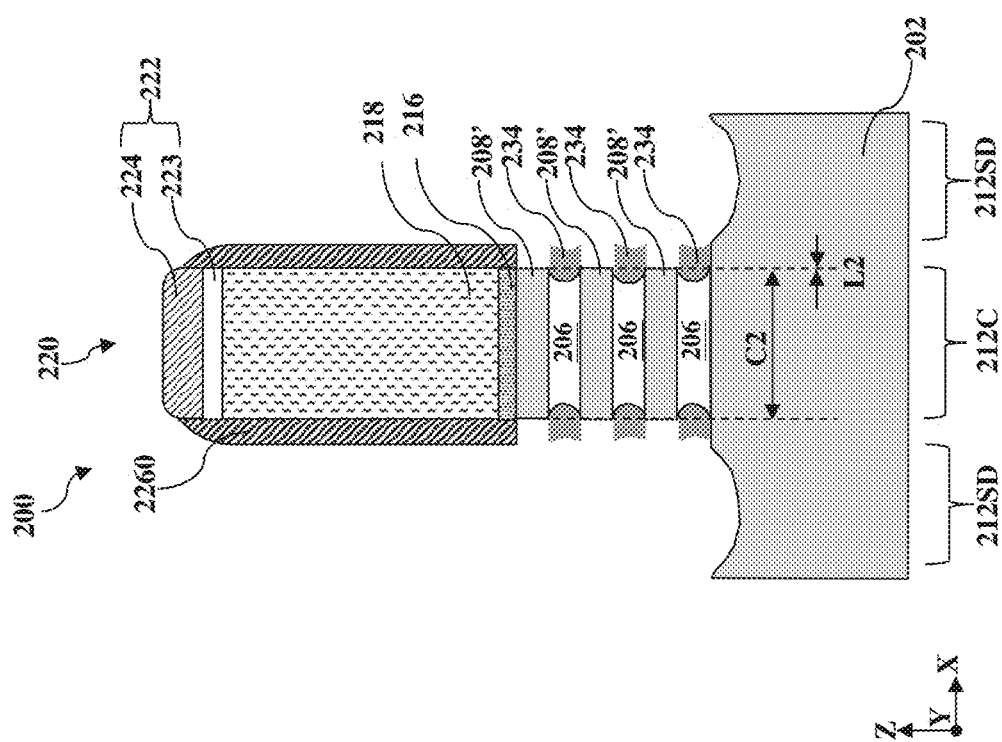
Figure 11B:
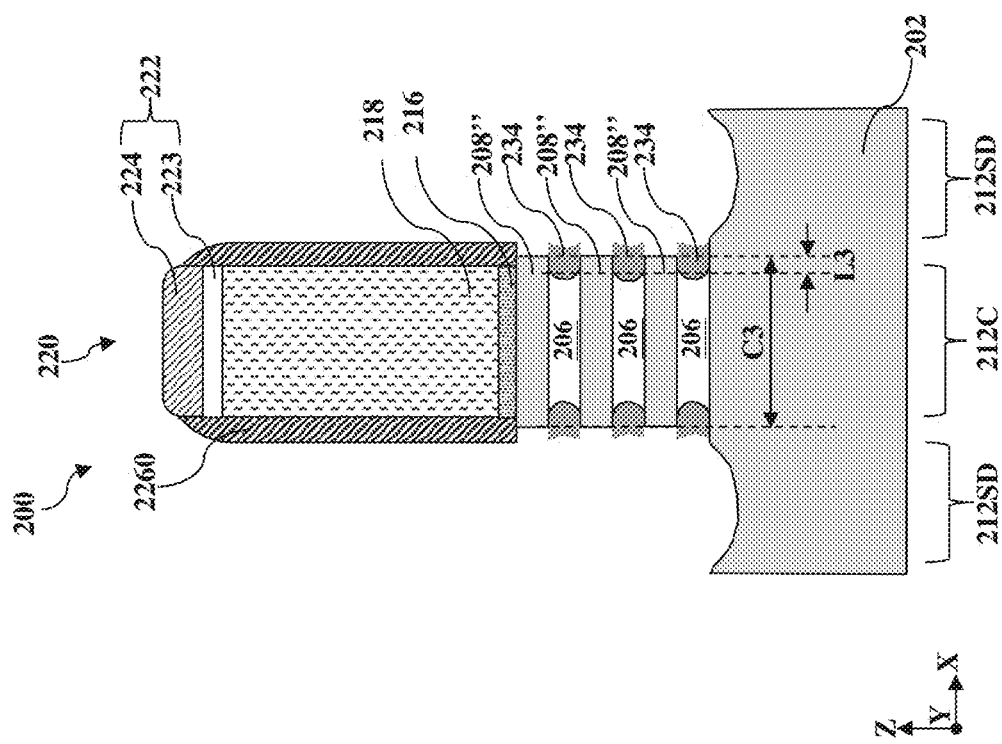

Referring to FIGS. 1, 11A and 11B, method 100 includes a block 114 where the channel layers 208 are selectively trimmed. FIGS. 11A and 11B illustrate two embodiments. In some embodiments represented in FIG. 11A, the channel layers 208 are trimmed along the X direction to form first channel layers 208' having end surfaces not overlapped by the top spacer 2260 along the Z direction. In other words, each end of the each of the channel layers 208 is trimmed by about 6 nm and about 10 nm to reach a second channel length C2. The first LDD proximity L1 is eliminated, resulting a second LDD proximity L2. In some instances, the second channel width C2 may be between about 10 nm and about 38 nm and the second LDD proximity L2 may be substantially zero. In some embodiments represented in FIG. 11A, a proximity push percentage may be calculated as a difference between the first LDD proximity L1 and the second LDD proximity L2 (i.e., (L1-L2) over the first LDD proximity L1. In the embodiment depicted in FIG. 11A, the proximity push ratio is 100% (i.e., (L1-L2)/L1). When the proximity push ratio is 100%, the proximity is reduced to zero and parasitic of the underlying MBC transistor may be reduced to zero.

In some embodiments represented in FIG. 11B, the channel layers 208 are trimmed along the X direction to form second channel layers 208" having end surfaces overlapped by the top spacer 2260 along the Z direction. In other words, each end of the each of the channel layers 208 is trimmed by about 3 nm and about 5 nm to reach a third channel length C3. The first LDD proximity L1 is cut to about half of its original value, resulting a third LDD proximity L3. In some instances, the third channel width C3 may be between about 16 nm and about 44 nm and the third LDD proximity L3 may be between about 1 nm and about 5 nm. In some embodiments represented in FIG. 11BA, a proximity push percentage may be calculated as a difference between the first LDD proximity L1 and the third LDD proximity L3 (i.e., (L1-L3) over the first LDD proximity L1. In the embodiment depicted in FIG. 11B, the proximity push ratio is between about 20% and about 50% (i.e., (L1-L3)/L1). While the 20%-50% push ratio does not completely eliminate the parasitic resistance of the underlying MBC transistor, it reduces the parasitic resistance and incomplete proximity push provides additional process tolerances when the sacrificial layers 206 are selectively reduced. In some implementations, the selective removal of the sacrificial layers 206 may still moderately etch the channel layers 208. The incomplete LDD proximity push provides a buffer to prevent gate-source/drain shorts.

In some implementations, the selective trimming at block 114 is performed using an isotropic etch process that is selective to the semiconductor material of the channel layers 208. For example, when the channel layers 208 are formed of silicon, the selective trimming at block 114 may include use of tetramethyl ammonium hydroxide (TMAH), potassium hydroxide (KOH), ethylene diamine pyrocatechol (EDP), or a mixture of nitric acid and hydrofluoric acid. Etchants used at block 114 may isotropically and selectively remove a portion of the channel layers 208 to trim the same. Because the purpose of the operations at block 114 is to push the source/drain-channel member junction closer to the channel region, operations at block 114 may also be referred to as a proximity push process.

Figure 12A:
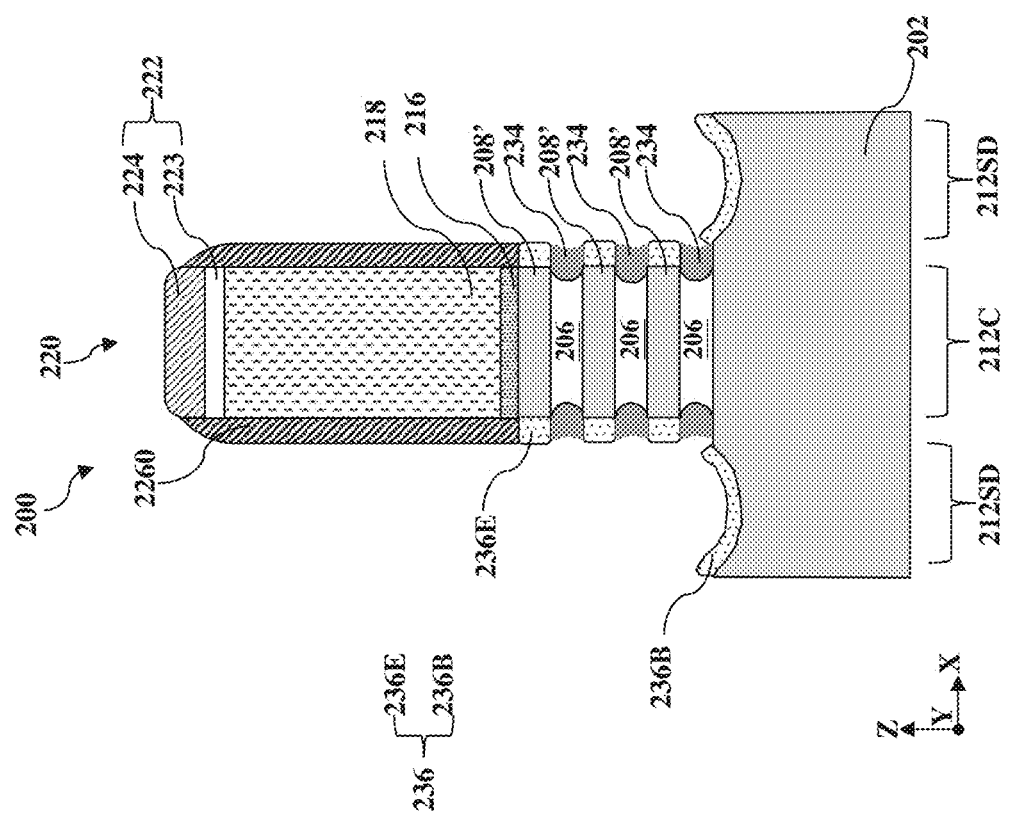
Figure 12B:
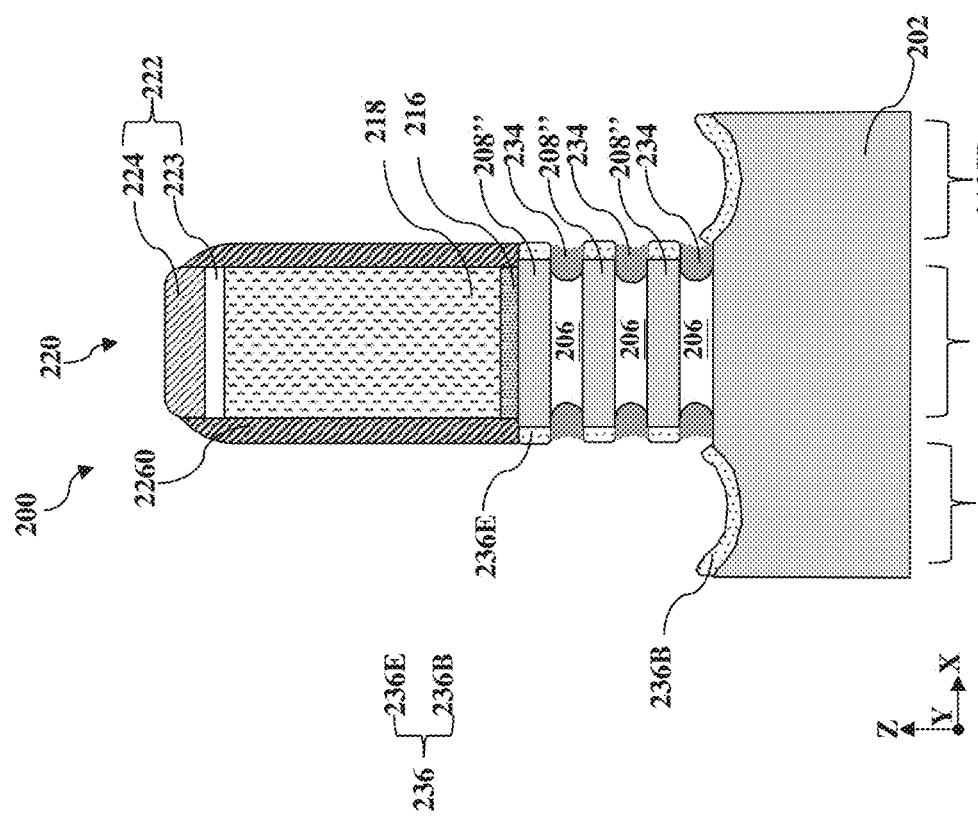

Referring to FIGS. 1, 12A and 12B, method 100 includes a block 116 where channel extension features 236E are formed. In some embodiments illustrated in FIGS. 12A and 12B, a semiconductor layer 236 is selectively deposited on end surfaces of the channel layers 208 (including the first channel layers 208' shown in FIG. 12A and the second channel layers 208" shown in FIG. 12B) to form the channel extension features 236E. The semiconductor layer 236 may be epitaxially deposited using vapor-phase epitaxy (VPE), ultra-high vacuum CVD (UHV-CVD), molecular beam epitaxy (MBE), and/or other suitable processes. The epitaxial deposition process at block 116 may use gaseous precursors, which interact with the composition of the substrate 202 as well as the end surfaces of the first channel layers 208' shown in FIG. 12A and the second channel layers 208" shown in FIG. 12B. In some implementations, parameters of the epitaxial deposition process at block 116 are selected such that the deposition of the semiconductor layer 236 is selective to semiconductor surfaces, including surfaces of the substrate 202 and the end surfaces of the first channel layers 208' shown in FIG. 12A and the second channel layers 208" shown in FIG. 12B. As shown in FIGS. 12A and 12B, depending on the location of deposition, the semiconductor layer 236 includes the channel extension features 236E in contact with the end surfaces of the first channel layers 208' and the second channel layers 208" as well as bottom portions 236B in contact with the substrate 202 exposed in the source/drain trench 228.

As each of the channel extension features 236E serves as a channel release etch stop layer and a lightly doped drain (LDD) feature, the semiconductor layer 236 may be formed of a doped semiconductor material that is more etch resistant than the source/drain features. In embodiments where a p-type MBC device is desired, the semiconductor layer 236 may include silicon (Si) doped with a p-type dopant, such as boron (B). For example, the semiconductor layer 236 may include boron-doped silicon (Si:B). In embodiments where an n-type MBC device is desired, the semiconductor layer 236 may include silicon (Si) doped with an n-type dopant, such as carbon (C), phosphorus (P), or both. For example, the semiconductor layer 236 may silicon doped with carbon and phosphorus (Si:C:P). It is noted that the semiconductor layer 236 is free of germanium content to have better etch resistance. While germanium content in the semiconductor layer 236 may help strain the channel members to boost hole mobility, presence of germanium would make the channel extension features 236E etch faster. As opposed to germanium, boron (B) and carbon (C) doping may improve the etch resistance of the semiconductor layer 236. Additionally, carbon (C) doping may prevent or retard out-diffusion of phosphorus (P) into the channel region. The channel extension features 236 serve as lightly doped drain (LDD) features and may be referred to as LDD features.

When the semiconductor layer 236 is formed of boron-doped silicon (Si:B) to be implemented in a p-type MBC transistor, the semiconductor layer 236 may include a boron dopant concentration between about $3\times10^{20}$ atoms/cm$^3$ and about $3\times10^{21}$ atoms/cm$^3$. When the boron concentration is below $3\times10^{20}$ atoms/cm$^3$, the channel extension feature 236E may undesirably increase resistance. $3\times10^{21}$ atoms/cm$^3$ is substantially the solubility limit of boron (B) in silicon. When the semiconductor layer 236 is formed of carbon and phosphorus-doped silicon (Si:C:P) to be implemented in an n-type MBC transistor, the semiconductor layer 236 may include a carbon dopant concentration between about $2\times10^{20}$ atoms/cm$^3$ and about $2\times10^{21}$ atoms/cm$^3$ and a phosphorus dopant concentration between about $1\times10^{20}$ atoms/cm$^3$ and about $5\times10^{21}$ atoms/cm$^3$. If the carbon dopant concentration is below $2\times10^{20}$ atoms/cm$^3$, the resultant channel extension feature 236E may not be sufficiently etch resistant as phosphorus dopant may increase the etch rate. If the phosphorus dopant concentration is below $1\times10^{19}$ atoms/cm$^3$, the resultant channel extension feature 236E may not be conductive enough. Along the X direction, which is along the gate-length direction, the channel extension feature 236E may have a thickness between about 2 nm and about 6 nm.

Reference is still made to FIGS. 12A and 12B. The channel extension features 236E may be sandwiched between two inner spacer features 234 or sandwiched between an inner spacer feature 234 and the top spacer 2260. As shown in FIG. 12A or 12B, the topmost channel extension feature 236E is vertically sandwiched between the top spacer 2260 and the topmost inner spacer feature 234 along the Z direction. The other channel extension features 236E is vertically sandwiched between two inner spacer features 234 along the Z direction. In the depicted embodiments, the channel extension features 236E are separate from one another and are spaced apart from the bottom portions 236B.

Figure 13A:
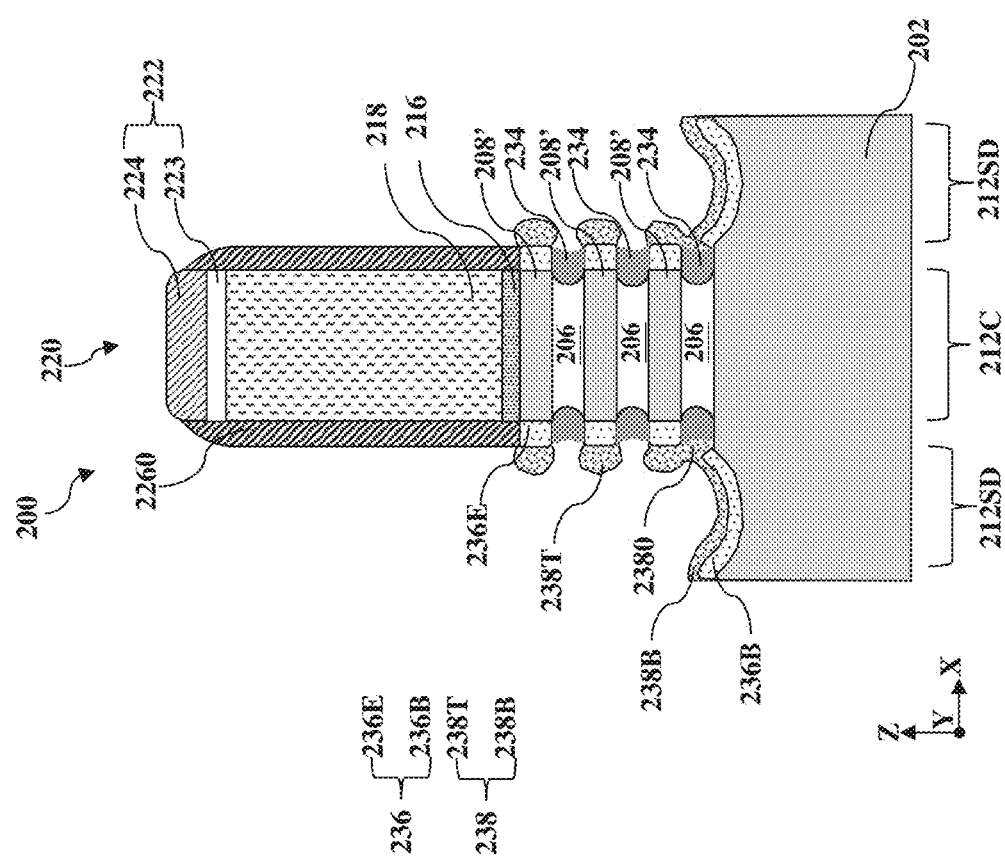
Figure 13B:
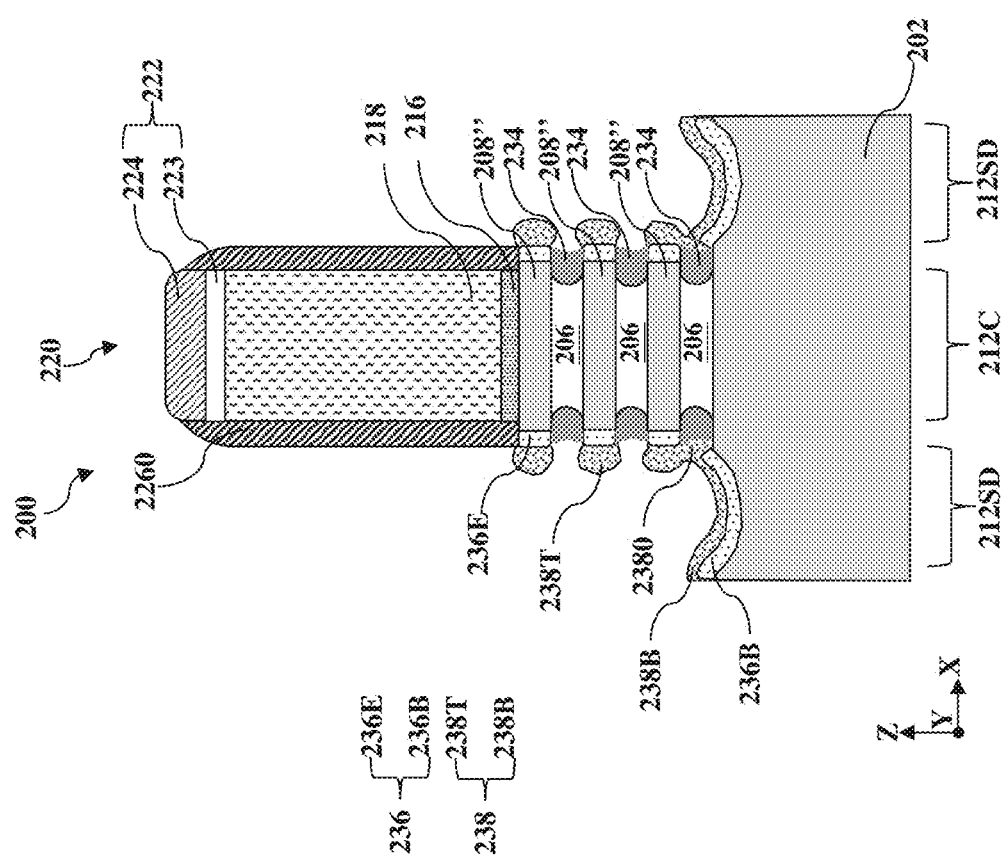

Referring to FIGS. 1, 13A and 13B, method 100 includes a block 118 where a first epitaxial layer 238 is deposited. In some implementations represented in FIGS. 13A and 13B, the first epitaxial layer 238 may be epitaxially and selectively formed from the exposed sidewalls of the channel extension features 236E and bottom portions 236B while sidewalls of the sacrificial layers 206 remain covered by the inner spacer features 234. Suitable epitaxial processes for block 118 include vapor-phase epitaxy (VPE), ultra-high vacuum CVD (UHV-CVD), molecular beam epitaxy (MBE), and/or other suitable processes. The epitaxial growth process at block 118 may use gaseous precursors, which interact the semiconductor layer 236, including the bottom portions 236B and the channel extension features 236E. In some embodiments, parameters of the epitaxial growth process at block 118 are selected such that the first epitaxial layer 238 is not epitaxially deposited on the inner spacer features 234. According to the present disclosure, upon conclusion of the operations at block 118, at least some inner spacer features 234 remain exposed. That is, at least some inner spacer features 234 are not completely covered by the first epitaxial layer 238. In some embodiments represented in FIGS. 13A and 13B, the first epitaxial layer 238 includes bottom portions 238B and top portions 238T. The top portions 238T are in contact with channel extension features 236 but do not grow over the inner spacer features 234. The bottom portions 238B of the first dielectric layer 238 are disposed over the bottom portions 236B of the first semiconductor layer 236. The bottom portions 238B may merge with a top portion 238T to extend over an inner spacer feature 234, such as the bottommost inner spacer features 234 shown in FIG. 13A or 13B. Here, the bottommost inner spacer features 234 refer to the inner spacer features 234 disposed vertically between the substrate 202 and the bottommost channel layers 208 (including the first channel layers 208' in FIG. 13A and the second channel layers 208" in FIG. 13B). While not explicitly shown, two or more top portions 238T of the first epitaxial layer 238 may merge to cover an inner spacer feature 234.

In some embodiments where a p-type MBC transistor is desired, the first epitaxial layer 238 includes silicon germanium (SiGe) and is doped with a p-type dopant, such as boron (B) or gallium (Ga). In some embodiments, the first epitaxial layer 238 includes a germanium content between about 20% and 30% and a silicon content between about 80% and about 70%. In one embodiment, the first epitaxial layer 238 includes a germanium content between about 24% and about 28%. This germanium content range is not trivial. When the germanium content in the first epitaxial layer is greater than about 30%, the lattice mismatch between silicon and germanium may cause too much defect at the interface between the first epitaxial layer 238 and the channel extension feature 236E, which may lead to increased resistance or device failure. When the germanium content is smaller than about 20%, the first epitaxial layer 238 may not sufficiently strain the channel layers 208 for improved hole mobility. When the p-type dopant is boron, a concentration of the p-type dopant in the first epitaxial layer 238 may be between about $2\times10^{20}$ atoms/cm$^3$ and about $3\times10^{21}$ atoms/cm$^3$. This p-type dopant concentration range is not trivial either. When the boron dopant concentration in the first epitaxial layer 238 is lower than about $2\times10^{20}$ atoms/cm$^3$, the resistance in the first epitaxial layer 238 may prevent satisfactory drive current (i.e., On-state current).

In some embodiments where an n-type MBC transistor is desired, the first epitaxial layer 238 includes silicon (Si) and is doped with an n-type dopant, such as phosphorus (P) or arsenic (As). When the n-type dopant is phosphorus (P), a concentration of the n-type dopant in the first epitaxial layer 238 may be between about $1\times10^{19}$ atoms/cm$^3$ and about $9\times10^{20}$ atoms/cm$^3$. This phosphorus dopant concentration range is not trivial. When the phosphorus dopant concentration in the first epitaxial layer 238 is lower than about $9\times10^{20}$ atoms/cm$^3$, the resistance in the first epitaxial layer 238 may prevent satisfactory drive current (i.e., On-state current). When the phosphorus dopant concentration in the first epitaxial layer 238 is greater than about $9\times10^{20}$ atoms/cm$^3$, the probability of drain-induced barrier lowering (DIBL) or leakage may increase. When the n-type dopant is arsenic (As), a concentration of the n-type dopant in the first epitaxial layer 238 may be between about $1\times10^{19}$ atoms/cm$^3$ and about $2\times10^{21}$ atoms/cm$^3$. This arsenic dopant concentration range is not trivial. When the arsenic dopant concentration in the first epitaxial layer 238 is lower than about $1\times10^{19}$ atoms/cm$^3$, the resistance in the first epitaxial layer 238 may prevent satisfactory drive current (i.e., On-state current). When the phosphorus dopant concentration in the first epitaxial layer 238 is greater than about $2\times10^{21}$ atoms/cm$^3$, the probability of drain-induced barrier lowering (DIBL) or leakage may increase.

Figure 14A:
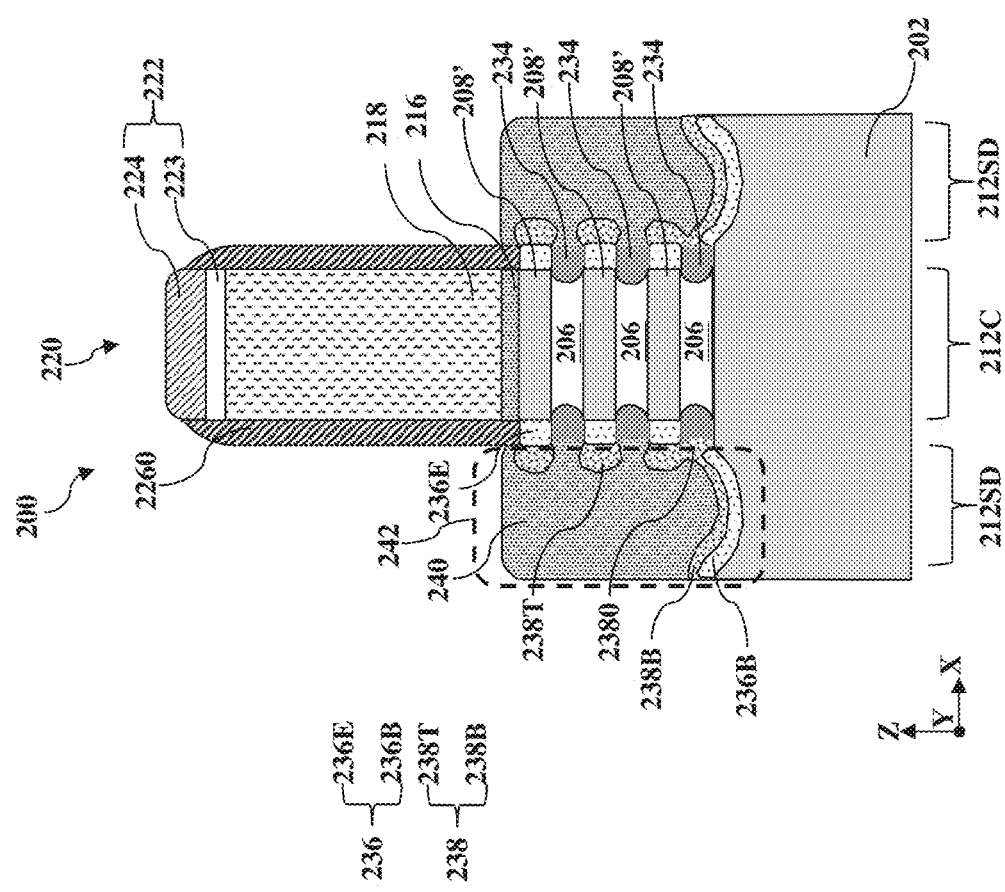
Figure 14B:
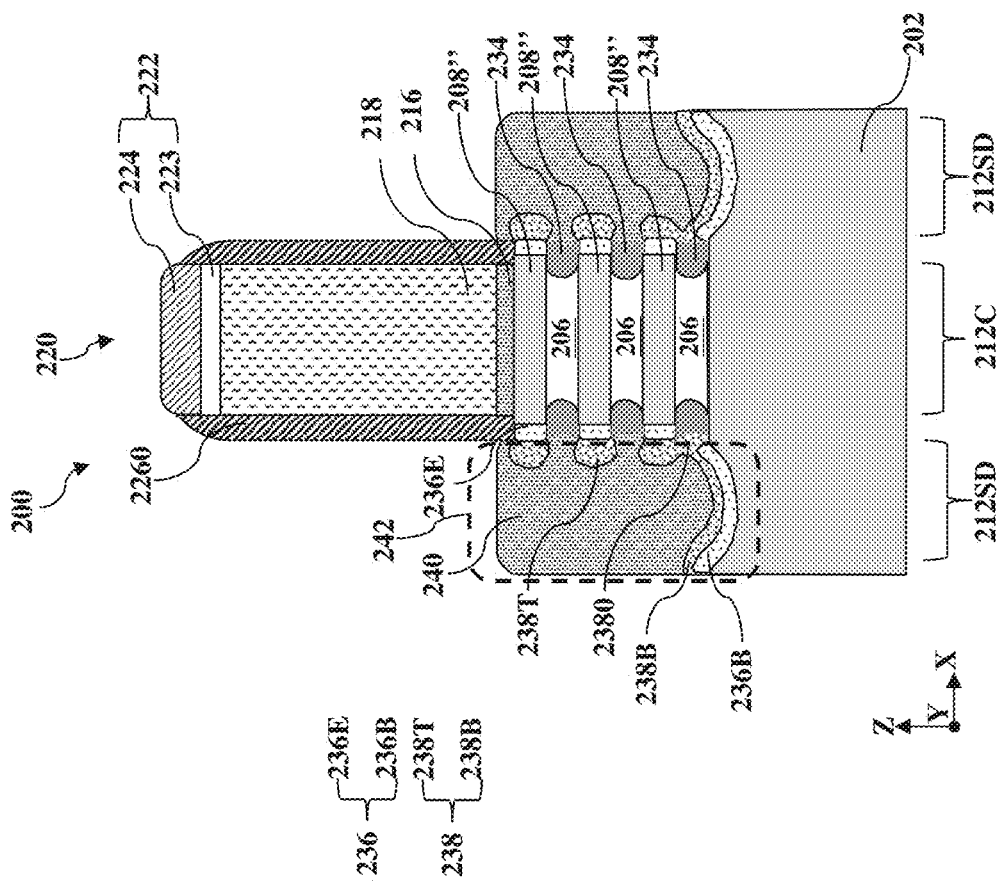

Referring to FIGS. 1, 14A and 14B, method 100 includes a block 120 where a second epitaxial layer 240 is deposited over the first epitaxial layer 238. In some embodiments, the second epitaxial layer 240 may be epitaxially and selectively formed from the first epitaxial layer 238. Suitable epitaxial processes for block 120 include vapor-phase epitaxy (VPE), ultra-high vacuum CVD (UHV-CVD), molecular beam epitaxy (MBE), and/or other suitable processes. The epitaxial growth process at block 120 may use gaseous precursors, which interact with the composition of the first epitaxial layer 238. The second epitaxial layer 240 is allowed to overgrow and merge over the exposed inner spacer features 234 and substantially fill the source/drain trenches 228. In some embodiments represented in FIGS. 14A and 14B, the second epitaxial layer 240 is separated or spaced apart from the semiconductor layer 236 by the first epitaxial layer 238. When the bottommost inner spacer features 234 are covered by the first epitaxial layer 238, the second epitaxial layer 240 is spaced apart from the bottommost inner spacer features 234. The second epitaxial layer 240 is in contact with the other inner spacer features 234.

In some embodiments where a p-type MBC transistor is desired, the second epitaxial layer 240 includes silicon germanium (SiGe) doped with a p-type dopant, such as boron (B) or gallium (Ga). The second epitaxial layer 240 serves as a low resistance layer and includes a doping concentration greater than that in the first epitaxial layer 238. In these embodiments, the boron doping concentration in the second epitaxial layer 240 may be between about $5\times10^{20}$ atoms/cm$^3$ and about $2\times10^{21}$ atoms/cm$^3$. When the boron doping concentration in the second epitaxial layer 240 is lower than $7\times10^{20}$ atoms/cm$^3$, the second epitaxial layer 240 may not be sufficiently conductive to achieve satisfactory drive current (i.e., On-state current). Moreover, solubility of the boron in the second epitaxial layer 240 may prevent the doping concentration of the boron to exceed $1.3\times10^{21}$ atoms/cm$^3$. Compared to the first epitaxial layer 238, the second epitaxial layer 240 includes a greater germanium content to enhance the strain on the first channel layers 208' or the second channel layers 208". In some implementations, the second epitaxial layer 240 includes a germanium content between about 37% and about 55% and a silicon content between about 45% and about 63%. It is noted that increase germanium content in the second epitaxial layer 240 may facilitate silicide formation.

In some embodiments where an n-type MBC transistor is desired, the second epitaxial layer 240 includes silicon (Si) doped with an n-type dopant, such as phosphorus (P) or arsenic (As). As the second epitaxial layer 240 serves as a low resistance layer, it includes a doping concentration greater than that in the first epitaxial layer 238. When the n-type dopant is phosphorus, then n-type doping concentration in the second epitaxial layer 240 may be between about $1\times10^{21}$ atoms/cm$^3$ and about $5\times10^{21}$ atoms/cm$^3$. When the phosphorus doping concentration in the second epitaxial layer 240 is lower than $1\times10^{21}$ atoms/cm$^3$, the second epitaxial layer 240 may not be sufficiently conductive to achieve satisfactory drive current (i.e., On-state current). Moreover, solubility of the phosphorus (P) in the second epitaxial layer 240 may prevent the doping concentration of the phosphorus to exceed $5\times10^{21}$ atoms/cm$^3$.

While not explicitly shown in the figures, method 100 may optionally include formation of a third epitaxial layer over the second epitaxial layer 240. The third epitaxial layer may serve as an etch stop layer to prevent undesirable damages to the second epitaxial layer 240. When a p-type MBC transistor is desired, the third epitaxial layer may include silicon (Si) or silicon-rich silicon germanium (SiGe) doped with boron (B). When an n-type MBC transistor is desired, the third epitaxial layer may include undoped silicon (Si).

A shown in FIGS. 14A and 14B, the first epitaxial layer 238, the second epitaxial layer 240, and the third epitaxial layer (if formed) may be collectively referred to a source/drain feature 242.

Figure 15A:
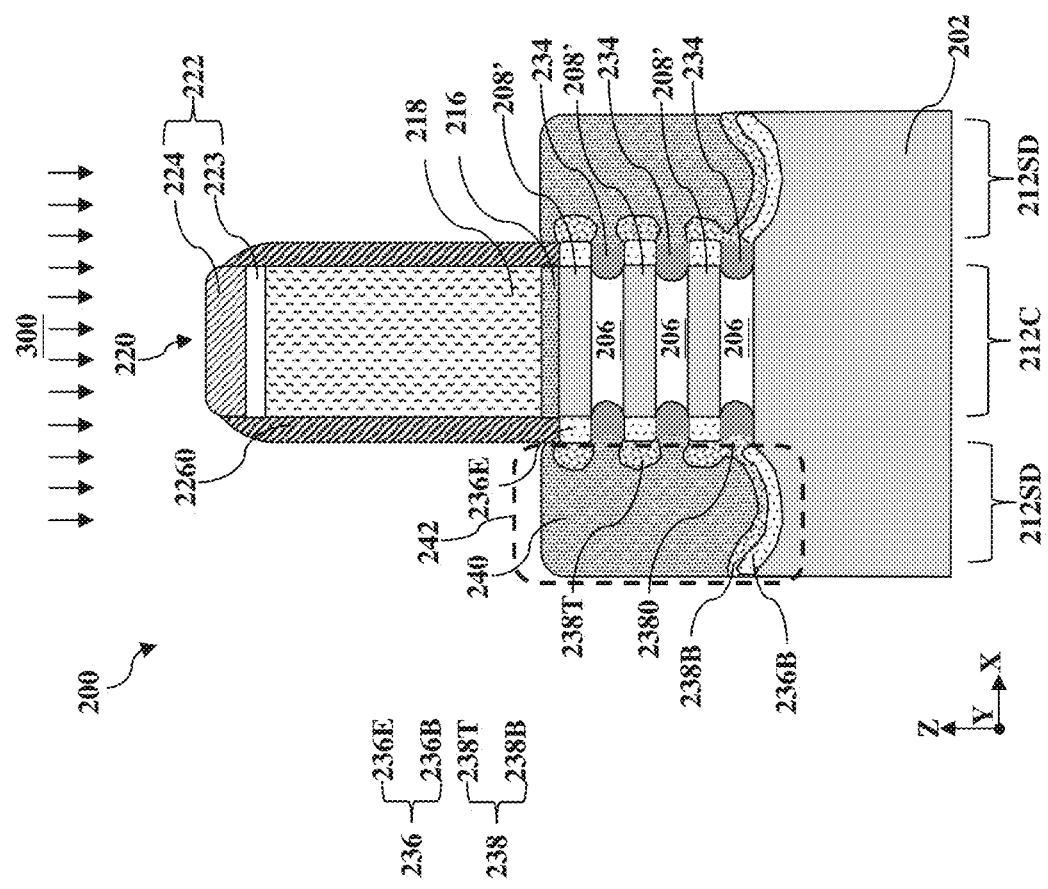
Figure 15B:
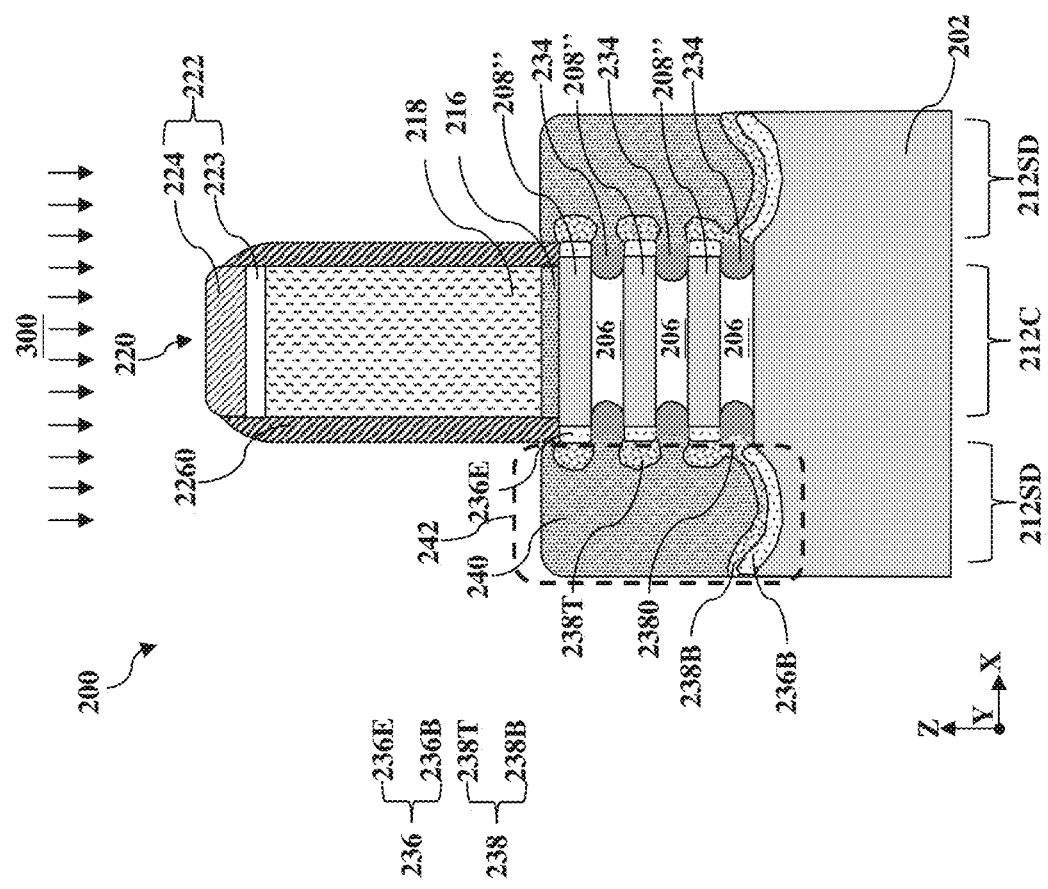

Referring to FIGS. 1, 15A and 15B, method 100 includes a block 122 where the workpiece 200 is annealed in an anneal process 300. In some implementation, the anneal process 300 may include a rapid thermal anneal (RTA) process, a laser spike anneal process, a flash anneal process, or a furnace anneal process. The anneal process 300 may include a peak anneal temperature between about 900° C. and about 1000° C. In these implementations, the peak anneal temperature may be maintained for a duration measured by seconds or microseconds. Throughout the anneal process 300, a desired electronic contribution of the dopant (such as p-type dopant boron (B) or n-type dopant phosphorus (P)) in the semiconductor host, such as silicon (Si) or silicon germanium (SiGe), may be obtained. The anneal process 300 may generate vacancies that facilitate movement of the p-type dopant from interstitial sites to substitutional lattice sites and reduce damages or defects in the lattice of the semiconductor host.

Figure 16A:
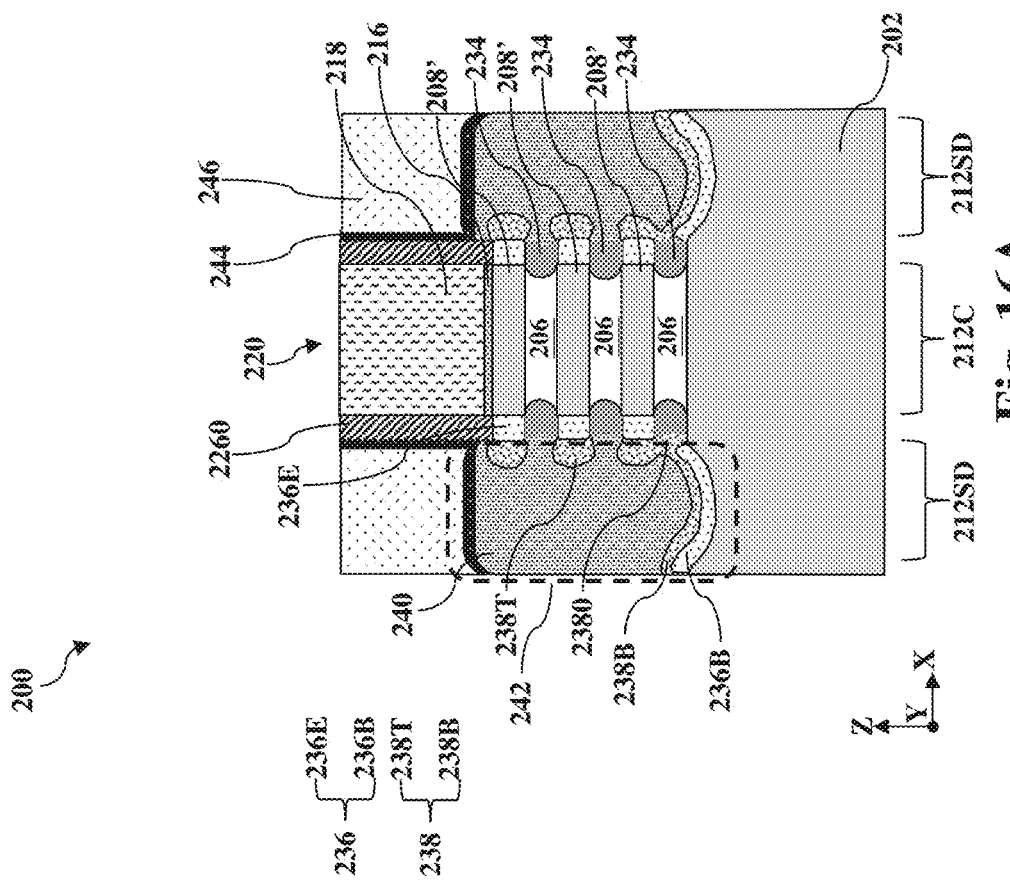
Figure 16B:
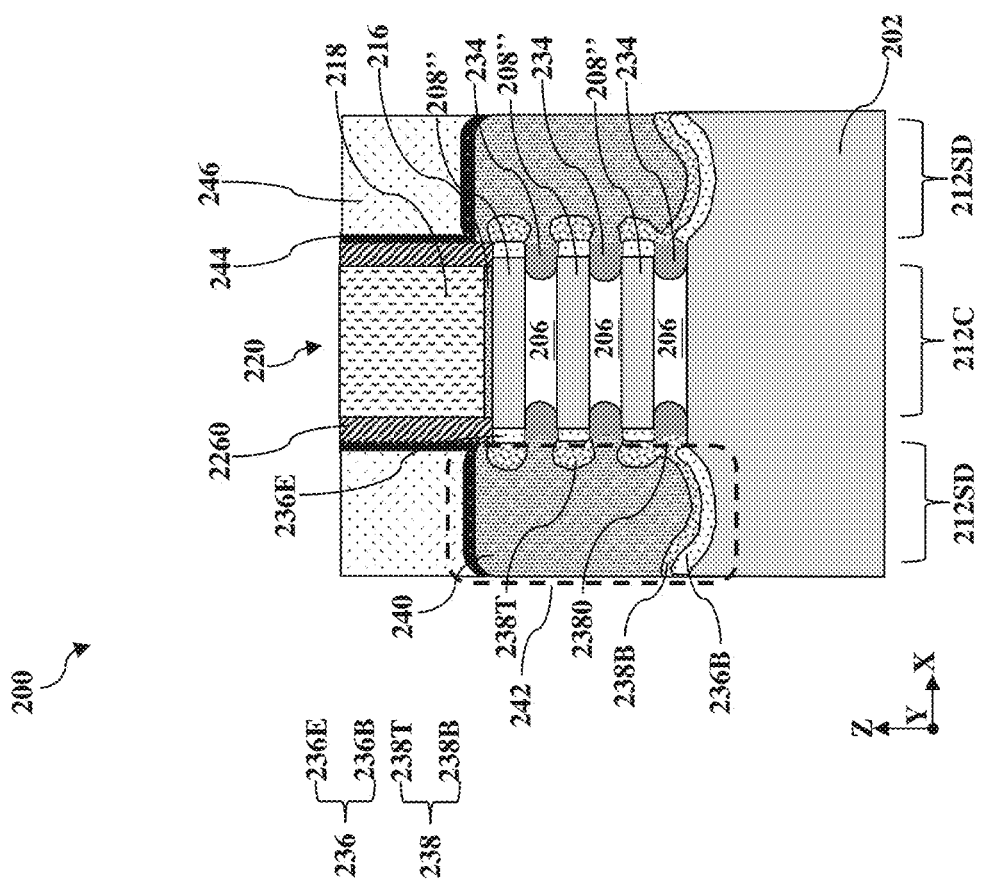

Referring to FIGS. 1, 16A-17A, and 16B-17B, method 100 includes a block 124 where the dummy gate stack 220 is removed. Operations at block 124 may include deposition of a contact etch stop layer (CESL) 244 over the workpiece 200 (shown in FIGS. 16A and 16B), deposition of an interlayer dielectric (ILD) layer 246 over the CESL 244 (shown in FIGS. 16A and 16B), and removal of the dummy gate stack 220 (shown in FIGS. 17A and 17B). Referring now to FIGS. 16A and 16B, the CESL 244 is deposited prior to deposition of the ILD layer 246. In some examples, the CESL 244 includes silicon nitride, silicon oxynitride, and/or other materials known in the art. The CESL 244 may be formed by ALD, plasma-enhanced chemical vapor deposition (PECVD) process and/or other suitable deposition processes. The ILD layer 246 is then deposited over the CESL 244. In some embodiments, the ILD layer 246 includes materials such as tetraethylorthosilicate (TEOS) oxide, undoped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 246 may be deposited by a PECVD process or other suitable deposition technique. In some embodiments, after formation of the ILD layer 246, the workpiece 200 may be annealed to improve integrity of the ILD layer 246. As shown in FIGS. 16, the CESL 244 may be disposed directly on top surfaces of the second epitaxial layer 240 or top surfaces of the third epitaxial layer (if formed).

Figure 17A:
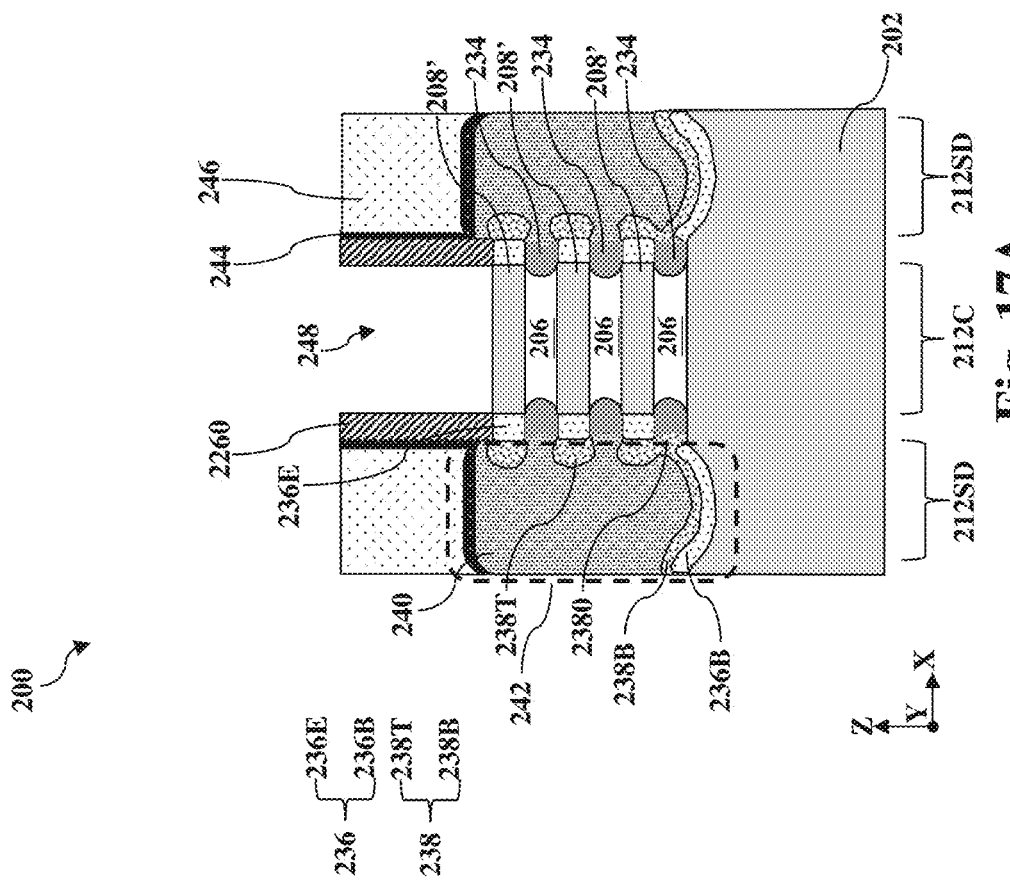
Figure 17B:
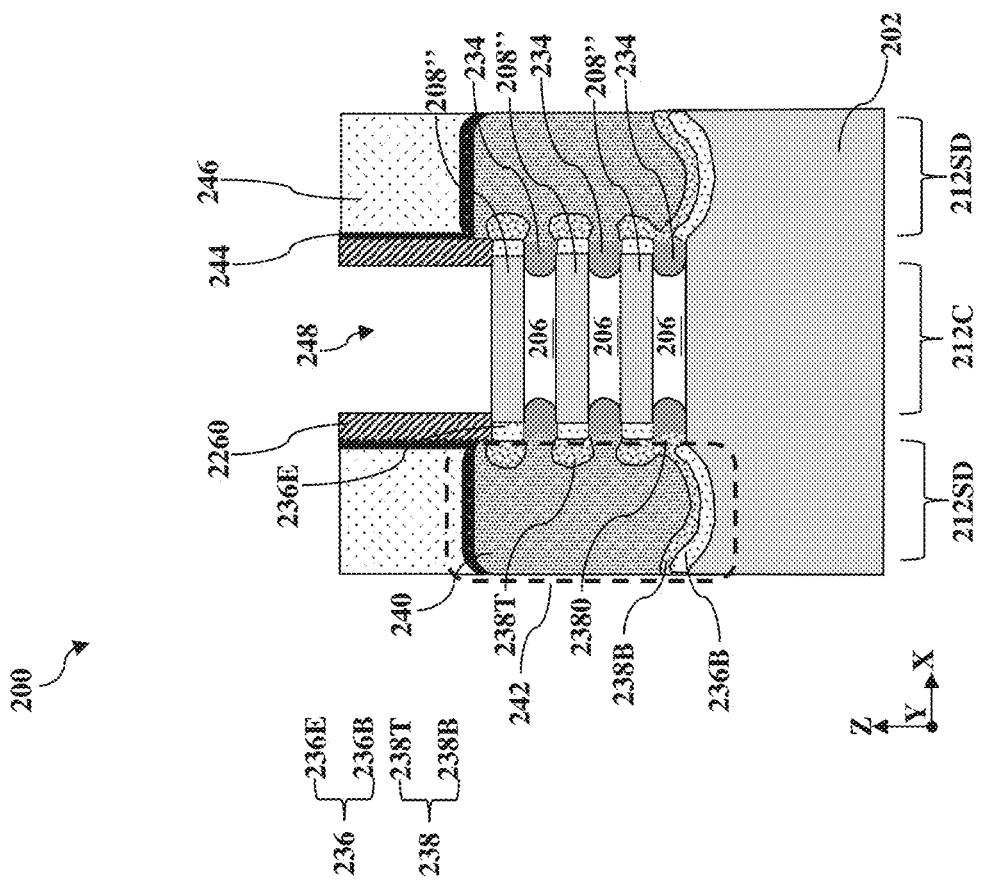

Referring still to FIGS. 16A and 16B, after the deposition of the CESL 244 and the ILD layer 246, the workpiece 200 may be planarized by a planarization process to expose the dummy gate stack 220. For example, the planarization process may include a chemical mechanical planarization (CMP) process. Exposure of the dummy gate stack 220 allows the removal of the dummy gate stack 220, as illustrated in FIGS. 17A and 17B. In some embodiments, the removal of the dummy gate stack 220 results in a gate trench 248 over the channel regions 212C. The removal of the dummy gate stack 220 may include one or more etching processes that are selective to the material of the dummy gate stack 220. For example, the removal of the dummy gate stack 220 may be performed using as a selective wet etch, a selective dry etch, or a combination thereof that is selective to the dummy gate stack 220. After the removal of the dummy gate stack 220, sidewalls of the channel layers 208 and the sacrificial layers 206 in the channel region 212C are exposed in the gate trench 248.

Figure 18A:
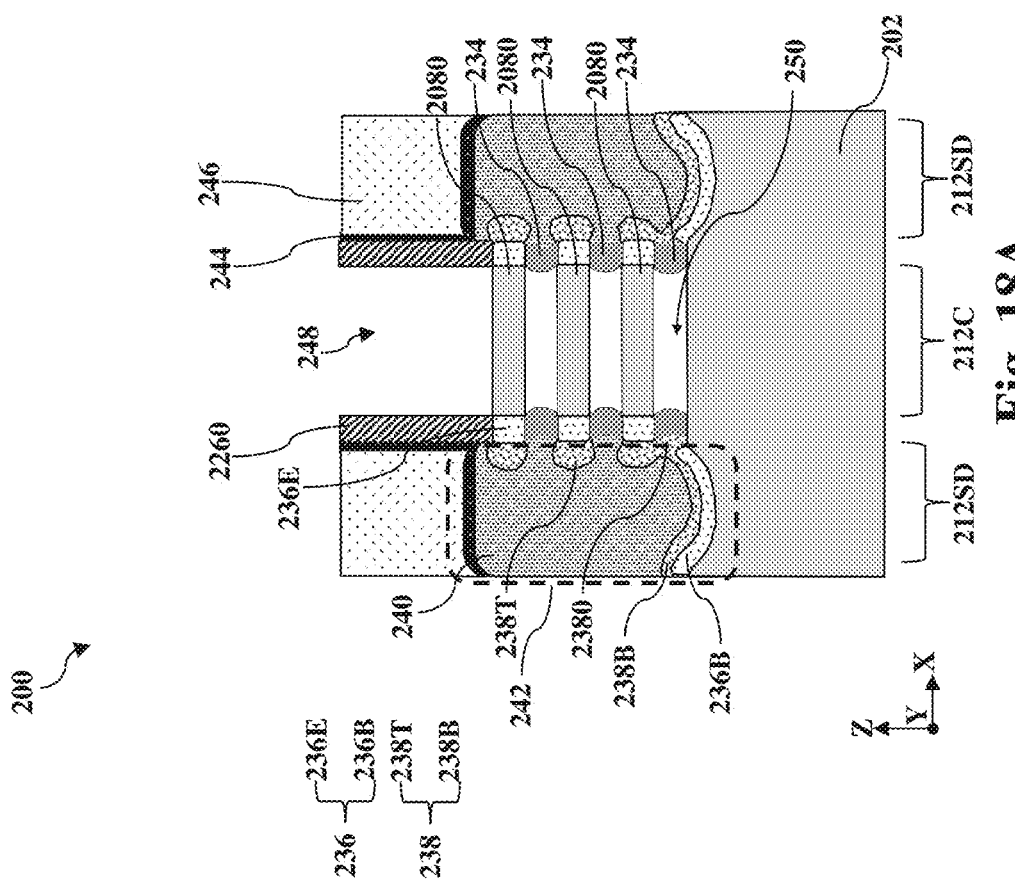
Figure 18B:
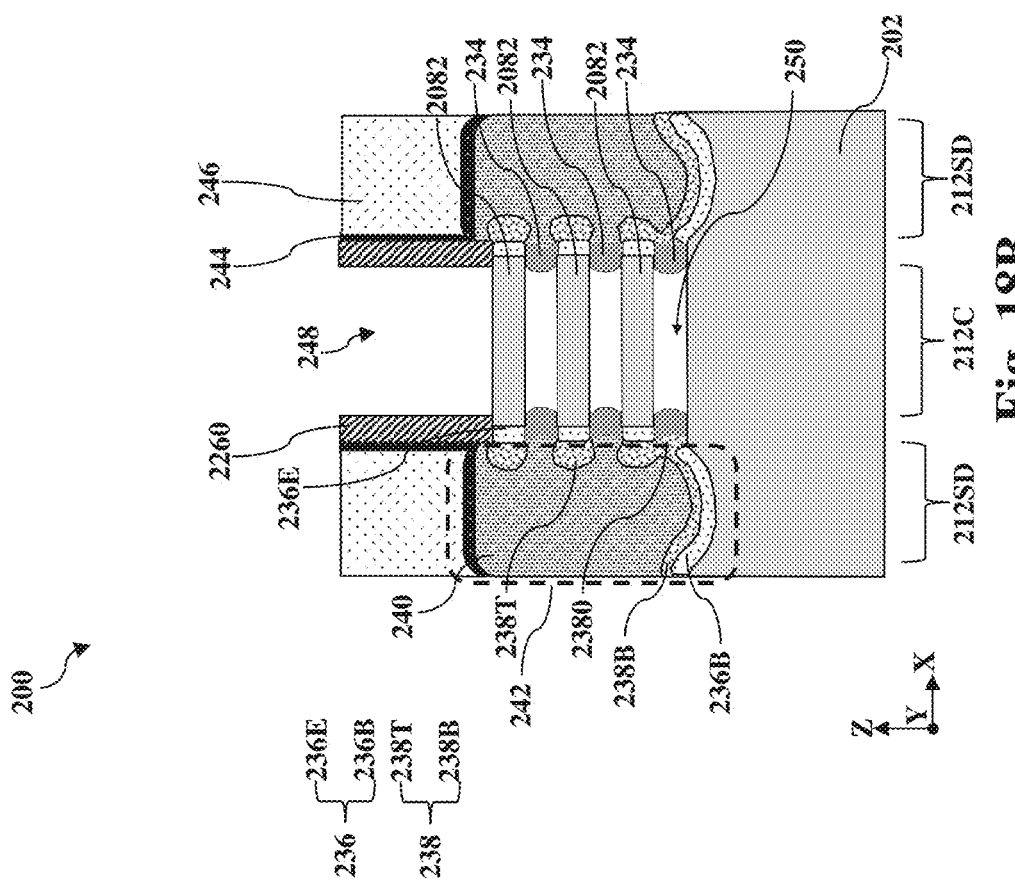

Referring to FIGS. 1, 18A and 18B, method 100 includes a block 126 where channel layers 108 (including first channel layers 208' shown in FIG. 18A and the second channel layers 208" shown in FIG. 18B) are released as channel members 2080. Referring to 18A and 18B, after the removal of the dummy gate stack 220 to form the gate trench 248, the method 100 selectively removes the sacrificial layers 206 between the channel layers 208 in the channel region 212C. The selective removal of the sacrificial layers 206 releases the first channel layers 208' in FIG. 18A to form the first channel members 2080 and the second channel layers 208" in FIG. 18B to form second channel members 2082. The selective removal of the sacrificial layers 206 also leave behind space 250 between first channel members 2080 or between second channel members 2082. The selective removal of the sacrificial layers 206 may be implemented by selective dry etch, selective wet etch, or other selective etch processes. An example selective dry etching process may include use of one or more fluorine-based etchants, such as fluorine gas or hydrofluorocarbons. An example selective wet etching process may include an APM etch (e.g., ammonia hydroxide-hydrogen peroxide-water mixture).

Figure 19A:
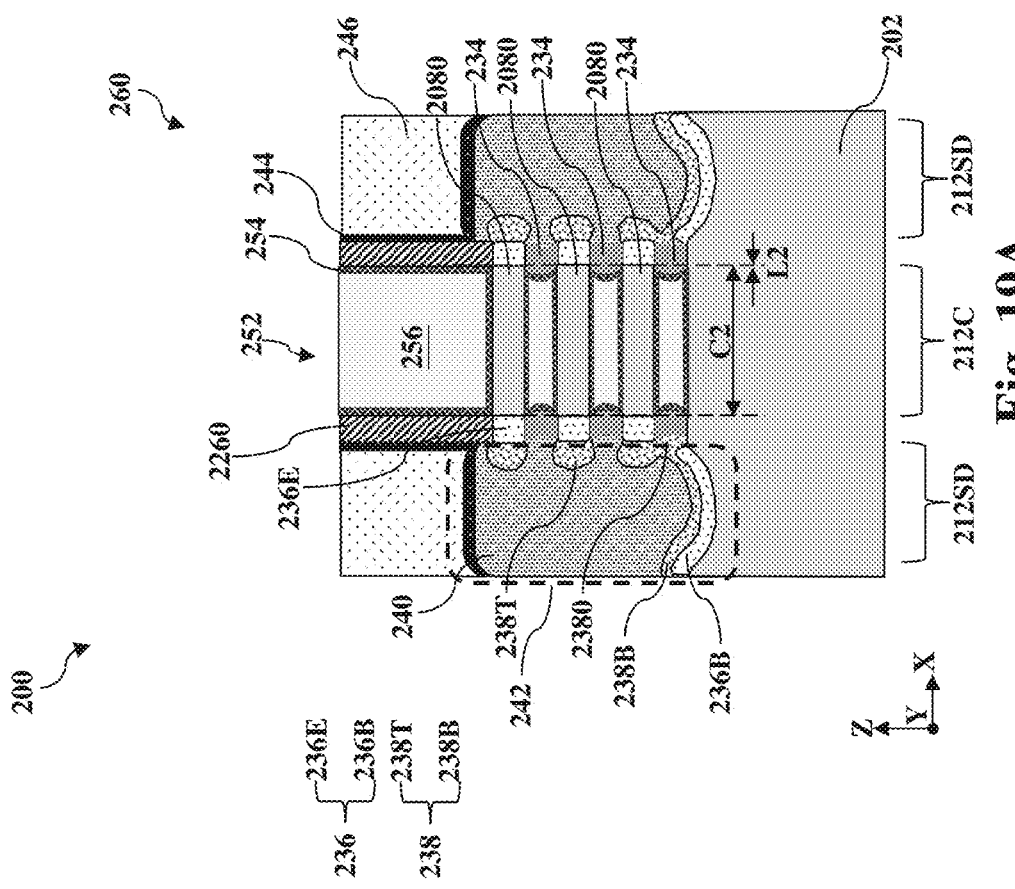

Referring to FIGS. 1, 19A and 19B, method 100 includes a block 128 where a gate structure 252 is formed. The method 100 may include further operations to form the gate structure 252 to wrap around each of the first channel members 2080 in FIG. 19A or each of the second channel members 2082 in FIG. 19B. In some embodiments, the gate structure 252 is formed within the gate trench 248 and into the space 250 left behind by the removal of the sacrificial layers 206. The gate structure 252 includes a gate dielectric layer 254 and a gate electrode layer 256 over the gate dielectric layer 254. In some embodiments, while not explicitly shown in the figures, the gate dielectric layer 254 includes an interfacial layer disposed on the first channel members 2080 or the second channel members 2082 and a high-K gate dielectric layer over the interfacial layer. High-K dielectric materials, as used and described herein, include dielectric materials having a high dielectric constant, for example, greater than that of thermal silicon oxide (~3.9). The interfacial layer may include a dielectric material such as silicon oxide, hafnium silicate, or silicon oxynitride. The interfacial layer may be formed by chemical oxidation, thermal oxidation, atomic layer deposition (ALD), chemical vapor deposition (CVD), and/or other suitable method. The high-K gate dielectric layer may include hafnium oxide. Alternatively, the high-K gate dielectric layer may include other high-K dielectric materials, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), $(Ba,Sr)TiO_3$ (BST), silicon nitride (SiN), silicon oxynitride (SiON), combinations thereof, or other suitable material. The high-K gate dielectric layer may be formed by ALD, physical vapor deposition (PVD), CVD, oxidation, and/or other suitable methods.

The gate electrode layer 256 of the gate structure 252 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer 256 may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. In various embodiments, the gate electrode layer 256 may be formed by ALD, PVD, CVD, e-beam evaporation, or other suitable process. In various embodiments, a CMP process may be performed to remove excessive metal, thereby providing a substantially planar top surface of the gate structure 252.

Reference is made to FIGS. 19A and 19B. Upon conclusion of the operations at block 128, an MBC transistor 260 is substantially formed. As described above, the MBC transistor 260 may be n-type or p-type. In some embodiments represented in FIG. 19A, the MBC transistor 260 includes first channel members 2080 that are vertically stacked along the Z direction perpendicular to the substrate 202. In some embodiments represented in FIG. 19B, the MBC transistor 260 includes second channel members 2082 that are vertically stacked along the Z direction perpendicular to the substrate 202. Each of the first channel members 2080 or the second channel members 2082 is wrapped around by the gate structure 252. The first channel members 2080 and the second channel members 2082 extend between two source/drain features 242 along the X direction. Each of the source/drain features 242 includes the first epitaxial layer 238, the second epitaxial layer 240, and the third epitaxial layer (if formed). The first channel members 2080 in FIG. 19A and the second channel members 2080 in FIG. 19B interface the source/drain features 242 by channel extension features 236E, which serve as LDD features. The first channel members 2080 and the second channel members 2082 differ in terms of their length along the X direction. In some embodiments represented in FIG. 19A, the MBC transistor 260 includes the second LDD proximity L2 where the junction between the first channel member 2080 and the channel extension feature 236E overlap with the vertical projection of the gate structure 252. That is, the second LDD proximity L2 may be substantially zero. In some embodiments represented in FIG. 19B, the MBC transistor 260 includes the third LDD proximity L3 where the junction between the second channel member 2082 and the channel extension feature 236E overlap falls out of the vertical projection of the gate structure 252. That is, the junction between the second channel member 2082 and the channel extension feature 236E falls within the vertical projection of the top gate spacer 2260. In some instances, the third LDD proximity L3 may be between 1 nm and about 5 nm.

Although not intended to be limiting, one or more embodiments of the present disclosure provide many benefits to a semiconductor device and the formation thereof. For example, embodiments of the present disclosure provide an MBC transistor that includes channel extension features extending between the channel members and the source/drain features. The channel extension features serve as lightly doped drain (LDD) features and function to reduce parasitic resistance.

In one exemplary aspect, the present disclosure is directed to a semiconductor structure. The semiconductor structure includes a first channel member and a second channel member disposed over the first channel member, a first channel extension feature coupled to the first channel member, a second channel extension feature coupled to the second channel member, and an inner spacer feature disposed between the first channel extension feature and the second channel extension feature.

In some embodiments, the first channel member and the second channel member include silicon germanium and the first channel extension feature and the second channel extension feature include silicon and a p-type dopant. In some implementations, the first channel member and the second channel member include silicon and the first channel extension feature and the second channel extension feature include silicon and an n-type dopant. In some instances, the semiconductor structure may further include a source/drain feature in contact with the first channel extension feature, the inner spacer feature and the second channel extension feature. In some embodiments, the first channel member and the second channel member extend lengthwise along a direction. The first channel extension feature is sandwiched between the first channel member and the source/drain feature along the direction. The second channel extension feature is sandwiched between the second channel member and the source/drain feature along the direction. In some implementations, the semiconductor structure may further include a gate structure wrapping around the first channel member and the second channel member and a top spacer extending along a sidewall of the gate structure. The second channel extension feature is sandwiched between the inner spacer feature and the top spacer. In some embodiments, the gate structure is spaced apart from the first channel extension feature and the second channel extension feature. In some embodiments, a portion of the second channel member is sandwiched between the inner spacer feature and the top spacer.

In another exemplary aspect, the present disclosure is directed to a semiconductor device. The semiconductor device includes a first source/drain feature and a second source/drain feature, a channel member extending lengthwise between the first source/drain feature and the second source/drain feature, a first channel extension feature sandwiched between the channel member and the first source/drain feature, a second channel extension feature sandwiched between the channel member and the second source/drain feature, a top spacer disposed over the first channel extension feature, and an inner spacer feature disposed below the first channel extension feature.

In some embodiments, the channel member includes silicon germanium and the first channel extension feature and the second channel extension feature include silicon and a p-type dopant. In some implementations, a portion of the channel member extends between the top spacer and the inner spacer feature. In some instances, the first source/drain feature is disposed over a substrate, the first source/drain feature includes a bottom epitaxial layer, a first epitaxial layer over the bottom epitaxial layer, and a second epitaxial layer over the first epitaxial layer, and a composition of the bottom epitaxial layer is the same as a composition of the first channel extension feature and the second channel extension feature. In some embodiments, the bottom epitaxial layer includes a first germanium content, the first epitaxial layer includes a second germanium content, the second epitaxial layer includes a third germanium content. The third germanium content is greater than the second germanium content and the second germanium content is greater than the first germanium content. In some embodiments, the first germanium content is substantially zero. In some implementations, the bottom epitaxial layer includes a first p-type dopant concentration, the first epitaxial layer includes a second p-type dopant concentration, the second epitaxial layer includes a third p-type dopant concentration, and the first p-type dopant concentration is greater than the second p-type dopant concentration, and the third p-type dopant concentration is greater than the first p-type dopant concentration.

In yet another exemplary aspect, the present disclosure is directed to a method. The method includes forming a stack over a substrate, wherein the stack includes a plurality of silicon layers interleaved by a plurality of silicon germanium layers, forming a fin-shaped structure from the stack and the substrate, the fin-shaped structure including a channel region and a source/drain region, forming a dummy gate stack over the channel region of the fin-shaped structure, depositing a top spacer over the dummy gate stack, recessing the source/drain region to form a source/drain trench that exposes sidewalls of the plurality of silicon layers and the plurality of silicon germanium layers, selectively and partially recessing the plurality of silicon germanium layers to form a plurality of inner spacer recesses, forming a plurality of inner spacer features in the plurality of inner spacer recesses, selectively trimming the plurality of silicon layers to form end surfaces, selectively depositing a semiconductor layer over the end surfaces, forming a source/drain feature in the source/drain trench to be in contact with the semiconductor layer and the plurality of inner spacer features, after the forming of the source/drain feature, removing the dummy gate stack, releasing the plurality of silicon layers in the channel region as a plurality of channel members, and forming a gate structure around each of the plurality of channel members.

In some embodiments, the semiconductor layer includes silicon and a p-type dopant. In some embodiments, selectively depositing of the semiconductor layer deposits the semiconductor layer on the end surfaces and a bottom surface of the source/drain trench, not on the plurality of inner spacer features. In some implementations, after the selectively depositing of the semiconductor layer, a portion of the semiconductor layer is disposed between the top spacer and one of the plurality of inner spacer features. In some embodiments, after the selectively depositing of the semiconductor layer, a portion of the semiconductor layer is disposed between two of the plurality of inner spacer features.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a plurality of nanostructures disposed over a substrate;
   a plurality of channel extension features, each of the plurality of channel extension features being in direct contact with an end surface of one of the plurality of nanostructures;
   a source/drain feature disposed over the substrate and in direct contact with the plurality of channel extension features;
   a plurality of inner spacer features interleaving the plurality of nanostructures; and
   a bottom epitaxial feature sandwiched between the substrate and the source/drain feature,
   wherein the plurality of channel extension features and the bottom epitaxial feature are of a same composition,
   wherein the plurality of inner spacer features are in direct contact with the plurality of nanostructures.

2. The semiconductor structure of claim 1,
   wherein the plurality of nanostructures comprise silicon germanium,
   wherein the plurality of channel extension features comprise silicon and a p-type dopant,
   wherein the plurality of channel extension features are substantially free of germanium.

3. The semiconductor structure of claim 1,
   wherein the plurality of nanostructures comprise silicon,
   wherein the plurality of channel extension features comprise silicon and an n-type dopant.

4. The semiconductor structure of claim 1,
   wherein the plurality of nanostructures extend lengthwise along a direction,
   wherein the plurality of channel extension features are sandwiched between the source/drain feature and the plurality of nanostructures along the direction.

5. The semiconductor structure of claim 4, further comprising:
   a gate structure wrapping around each of the plurality of nanostructures,
   wherein the plurality of nanostructures comprise a channel length along the direction,
   wherein the gate structure comprises a gate length along the direction,
   wherein the channel length is greater than the gate length.

6. The semiconductor structure of claim 5, further comprising:
   a top spacer over the plurality of nanostructures and extending along a sidewall of the gate structure,
   wherein the top spacer comprises a first thickness along the direction,
   wherein each of the plurality of channel extension features comprises a second thickness along the direction,
   wherein the first thickness is greater than the second thickness.

7. The semiconductor structure of claim 6, wherein the second thickness is between about 2 nm and about 6 nm.

8. The semiconductor structure of claim 1, wherein the source/drain feature comprises:
   a first epitaxial layer in contact with the plurality of channel extension features and the bottom epitaxial feature; and
   a second epitaxial layer spaced apart from the plurality of channel extension features and the bottom epitaxial feature by the first epitaxial layer.

9. A semiconductor structure, comprising:
   a substrate;
   a first source/drain feature and a second source/drain feature disposed over the substrate;
   a plurality of channel members extending between the first source/drain feature and the second source/drain feature along a direction;
   a first plurality of channel extension features disposed between the first source/drain feature and the plurality of channel members along the direction; and
   a first plurality of inner spacer features interleaving and in contact with the first plurality of channel extension features as well as the plurality of channel members.

10. The semiconductor structure of claim 9, further comprising:
    a bottom epitaxial feature sandwiched between the substrate and the first source/drain feature as well as between the substrate and the second source/drain feature,
    wherein the first plurality of channel extension features and the bottom epitaxial feature are of a same composition.

11. The semiconductor structure of claim 10,
    wherein the plurality of channel members comprise silicon germanium,
    wherein the first plurality of channel extension features comprise silicon and a p-type dopant,
    wherein the first plurality of channel extension features are substantially free of germanium, wherein the first source/drain feature and the second source/drain feature comprise silicon germanium and the p-type dopant.

12. The semiconductor structure of claim 10, wherein the plurality of channel members comprise silicon,
wherein the first plurality of channel extension features comprise silicon and an n-type dopant,
wherein the first source/drain feature and the second source/drain feature comprise silicon and an n-type dopant.

13. The semiconductor structure of claim 9, further comprising:
a gate structure wrapping around each of the plurality of channel members; and
a top spacer over the plurality of channel members and extending along a sidewall of the gate structure.

14. The semiconductor structure of claim 13,
wherein the top spacer comprises a first thickness along the direction,
wherein each of the first plurality of channel extension features comprises a second thickness along the direction,
wherein the first thickness is greater than the second thickness.

15. The semiconductor structure of claim 14, wherein the second thickness is between about 2 nm and about 6 nm.

16. A method, comprising:
receiving a workpiece comprising:
a substrate, and
a fin-shaped structure over the substrate and comprising a channel region and a source/drain region adjacent the channel region, wherein the fin-shaped structure comprises a plurality of channel layers interleaved by a plurality of sacrificial layers;
forming a dummy gate stack over the channel region;
recessing the source/drain region to form a source/drain trench that exposes portions of the substrate, sidewalls of the plurality of channel layers and the plurality of sacrificial layers;
selectively and partially recessing the plurality of sacrificial layers to form a plurality of inner spacer recesses;
forming a plurality of inner spacer features in the plurality of inner spacer recesses;
after the forming of the plurality of inner spacer features, selectively trimming the plurality of channel layers to form end surfaces;
selectively depositing a semiconductor layer on the end surfaces and the exposed portions of the substrate to form channel extension features in contact with the end surfaces and bottom epitaxial features on the portions of the substrate;
after the selectively depositing, forming a source/drain feature in the source/drain trench to be in contact with the channel extension features; and
after the forming of the source/drain feature, replacing the dummy gate stack with a gate structure.

17. The method of claim 16, wherein the replacing of the dummy gate stack comprises:
removing the dummy gate stack;
selectively removing the plurality of sacrificial layers in the channel region to release the plurality of channel layers in the channel region as a plurality of channel members; and
forming the gate structure to wrap around each of the plurality of channel members.

18. The method of claim 16, wherein the semiconductor layer comprises silicon and a p-type dopant.

19. The method of claim 16, wherein the channel extension features are in contact with the plurality of inner spacer features.

20. The method of claim 16, wherein the plurality of inner spacer features comprise silicon oxide, silicon oxycarbonitride, silicon nitride, silicon oxynitride, carbon-rich silicon carbonitride, aluminum oxide, zirconium oxide, tantalum oxide, yttrium oxide, titanium oxide, or lanthanum oxide.

* * * * *